United States Patent
Kim

(10) Patent No.: US 12,386,535 B2
(45) Date of Patent: Aug. 12, 2025

(54) STORAGE DEVICE, ELECTRONIC DEVICE, AND METHOD FOR CONTROLLING MEMORY

(71) Applicant: SAMSUNG ELECTRONICS CO., LTD., Suwon-si (KR)

(72) Inventor: Jonghwa Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 43 days.

(21) Appl. No.: 18/480,919

(22) Filed: Oct. 4, 2023

(65) Prior Publication Data
US 2024/0311027 A1    Sep. 19, 2024

(30) Foreign Application Priority Data
Mar. 15, 2023   (KR) .................. 10-2023-0034083

(51) Int. Cl.
*G06F 3/06* (2006.01)

(52) U.S. Cl.
CPC ............ *G06F 3/064* (2013.01); *G06F 3/0607* (2013.01); *G06F 3/0652* (2013.01); *G06F 3/0679* (2013.01)

(58) Field of Classification Search
CPC ...... G06F 3/0652; G06F 3/064; G06F 3/0607; G06F 3/0679; G06F 3/0658; G06F 12/0253; G06F 2212/7205; G11C 2216/24; G11C 16/10; G11C 16/32; G11C 16/16; G11C 16/08

See application file for complete search history.

(56) References Cited

U.S. PATENT DOCUMENTS

| | | | |
|---|---|---|---|
| 9,400,749 B1* | 7/2016 | Kuzmin | G06F 12/0246 |
| 9,916,900 B2 | 3/2018 | Kim et al. | |
| 9,928,165 B2 | 3/2018 | Kwak | |
| 10,431,315 B2 | 10/2019 | Lee et al. | |
| 11,468,952 B2 | 10/2022 | Kim et al. | |
| 2008/0034174 A1* | 2/2008 | Traister | G06F 12/0246 |
| | | | 711/159 |
| 2012/0254515 A1* | 10/2012 | Melik-Martirosian | ...... |
| | | | G06F 12/0246 |
| | | | 711/E12.008 |
| 2014/0047167 A1 | 2/2014 | Kwak | |
| 2016/0027518 A1 | 1/2016 | Zettsu | |
| 2016/0379715 A1 | 12/2016 | Pelster et al. | |
| 2019/0087128 A1 | 3/2019 | Shin | |

(Continued)

FOREIGN PATENT DOCUMENTS

| | | |
|---|---|---|
| JP | 2001-184255 | 7/2001 |
| KR | 10-2083490 | 3/2020 |

OTHER PUBLICATIONS

Extended European Search Report in the European Appln. No. 23203754.9, mailed on Apr. 18, 2024, 8 pages.

*Primary Examiner* — Curtis James Kortman
(74) *Attorney, Agent, or Firm* — Fish & Richardson P.C.

(57) ABSTRACT

A storage device includes: a non-volatile memory configured to include a plurality of blocks having a plurality of word lines and to write data to the blocks or to erase data of the blocks; and a splitter configured to obtain write times for a plurality of word lines of a first block of the blocks while the non-volatile memory writes data in the first block, and to command the non-volatile memory to perform an erase operation on a second block of the blocks by the reference time when a write time for one of the word lines is shorter than the reference time.

20 Claims, 25 Drawing Sheets

(56) References Cited

U.S. PATENT DOCUMENTS

2022/0129197 A1   4/2022  Choi et al.
2023/0297471 A1*  9/2023  Hong ............... G11C 29/50016
                                              714/42

* cited by examiner

STORAGE DEVICE, ELECTRONIC DEVICE, AND METHOD FOR CONTROLLING MEMORY

CROSS-REFERENCE TO RELATED APPLICATION

This application claims priority to and the benefit of Korean Patent Application No. 10-2023-0034083, filed in the Korean Intellectual Property Office on Mar. 15, 2023, the entire contents of which are incorporated herein by reference.

BACKGROUND

(a) Field

The disclosure relates to a storage device, a storage system, and a memory control method.

(b) Description of the Related Art

As a semiconductor memory device, a non-volatile memory (NVM) device includes a plurality of memory cells that non-volatilely store data. As an example of the NVM device, a flash memory device may be used in a mobile phone, a digital camera, a personal digital assistant (PDA), a mobile computer device, a stationary computer device, and other devices.

A flash memory device includes a plurality of blocks, and each of the blocks may include a plurality of word lines. Characteristics of the word lines in each block may be different from each other due to a structure of the flash memory device, and word lines in a specific area (e.g., a degraded area) may have lower characteristics than those of word lines in other areas (e.g., a normal area). Due to such a difference in these characteristics, a data write time may be different even for word lines of a same block, but the flash memory device may be allocated the same time for quality of service (QOS), and may write data during the allocated time.

SUMMARY

Some embodiments may provide a storage device, a storage system, and a memory control method, capable of performing a data erasing operation during a remaining time of a time allocated for data writing.

An embodiment of the present disclosure provides a storage device including: a NVM configured to include a plurality of blocks having a plurality of word lines and to write data to the blocks or to erase data of the blocks; and a splitter configured to obtain write times for a plurality of word lines of a first block of the blocks while the NVM writes data in the first block, and to command the NVM to perform an erase operation on a second block of the blocks by the reference time when a write time for one of the word lines is shorter than the reference time.

The splitter may determine a longest write time when the NVM writes data to the word lines of the first block as the reference time.

The splitter may command to divide the erase operation to complete data erasing in the second block when the NVM completes data writing in the first block.

The splitter may command the NVM to equally divide and perform the erase operation.

The word lines of the first block may have remaining times corresponding to the write times, and the splitter may command the NVM to divide and perform the erase operation in proportion to the remaining times.

The splitter may command the NVM to divide and perform the erase operation based on a minimum time for the erase operation.

The word lines of the first block may have remaining times corresponding to the write times, the splitter may compare the minimum time with a remaining time of each word line, and instructs the erase operation according to a comparison result thereof, and the remaining time may be a time from a time of writing data to a word line to the reference time.

The splitter may command the erase operation when the remaining time is longer than the minimum time, and may not command the erase operation when the remaining time is shorter than the minimum time.

The splitter may transmit an erase start signal to the NVM when the write time is shorter than the reference time and may transmit an erase stop signal to the NVM when the reference time is reached, and the NVM may start the erase operation in response to the erase start signal and may stop the erase operation in response to the erase stop signal.

The splitter may command an erase operation for a third block among the blocks when the write time is shorter than the reference time when all data of the second block is erased.

The splitter may command an idle state when a write time is shorter than the reference time when all data of the second block is erased.

The storage device may further include a controller configured to transmit a write signal corresponding to a write command to the NVM in response to the write command from a host, and the NVM may write data to the first block in response to the write signal, and may transmit a completion signal to the controller when data writing to one word line of the first block is completed.

The controller may calculate a remaining time based on the completion signal and may transmit the remaining time to the splitter, and the splitter may command the erase operation based on the remaining time.

The storage device may further include a controller configured to transmit a write signal corresponding to a write command to the NVM in response to the write command from a host, the NVM may write data to the first block in response to the write signal and may transmit a write start time and a write completion time to the splitter when data writing to one word line of the first block is completed, and the splitter may calculate a remaining time based on the write start time and the write completion time, and commands the erase operation based on the remaining time.

The storage device may further include a controller configured to transmit a write signal corresponding to a write command to the splitter and the NVM in response to the write command from a host, the NVM may write data to the first block in response to the write signal and may transmit a completion signal to the splitter when data writing to one word line of the first block is completed, and the splitter may calculate a remaining time based on the write signal and the completion signal and may command the erase operation based on the remaining time.

An embodiment of the present disclosure provides a storage system including: a host configured to command to write data on a first block included in a storage device and to erase data on a second block; and the storage device configured to erase data in the second block for a remaining time while writing data in the first block in response to a command from the host.

The storage device may determine a longest time among write times for a plurality of word lines of the first block as a reference time and may determine a difference between the reference time and the write time as the remaining time.

The storage device may erase data of the second block when the remaining time is longer than a minimum time for an erase operation.

The storage device may erase data of another block for the remaining time or is in an idle state when all data of the second block is erased.

An embodiment of the present disclosure provides a defect detection method including: obtaining a remaining time for each word line of a block target block of a NVM based on a longest write time while data is being written to a plurality of word lines of the write target block; and erasing data of an erase target block for a remaining time for each of the word lines.

DETAILED DESCRIPTION OF THE EMBODIMENTS

Figure 1:
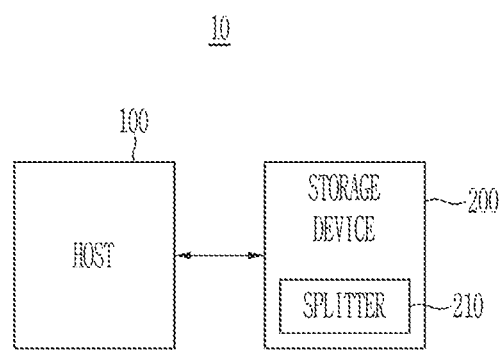
FIG. 1 illustrates a block diagram of a storage system according to an embodiment.

In the following detailed description, only certain embodiments of the present disclosure have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. In a flowchart described with reference to the drawings, an order of operations may be changed, several operations may be merged, some operations may be divided, and specific operations may not be performed.

In addition, expressions written in the singular may be construed in the singular or plural unless an explicit expression such as "one" or "single" is used. Terms including ordinal numbers such as first, second, and the like will be used only to describe various components, and are not to be interpreted as limiting these components. These terms may be used for the purpose of distinguishing one constituent element from other constituent elements.

FIG. 1 illustrates a block diagram of a storage system according to an embodiment.

Referring to FIG. 1, a storage system 10 includes a host 100 and a storage device 200. The storage system 10 may be used by a user. For example, a user may use the storage device 200 through the host 100. In an embodiment, the storage system 10 may be a personal computer (PC), a laptop computer, a server, a media player, a digital camera, a navigation device, a black box, a vehicle electric device, and the like. Alternatively, the computer system 10 may be a mobile system such as a portable communication terminal (mobile phone), a smart phone, a tablet personal computer (PC), a wearable device, a healthcare device, or an Internet of things (IoT) device.

The host 100 may control overall operations of the storage system 10. In an embodiment, the host 100 may be one of various processors such as a central processing unit (CPU), a graphics processing unit (GPU), a neural processing unit (NPU), a tensor processing unit (TPU), a data processing unit (DPU), and an application processor (AP). In an embodiment, the host 100 may include a single-core processor or a multi-core processor.

The host 100 may generate a signal for the storage device 200. The signal may include commands and addresses. In an embodiment, the command may include an activate command, a read command, a write command, and an erase command. The host 100 may transmit a signal to the storage device 200 through an interface.

The activate command may be a command for converting a target word line of a memory in the storage device 200 into an active state in order to write data to or to read data from the storage device 200. The storage device 200 may activate (e.g., drive) a memory cell of a target word line in response to the activate command. The read command, the write command, and the erase command may be commands for performing a read, write, and erase operation, respectively, on a target memory cell of a word line converted to the active state.

The storage device 200 may operate based on a command of the host 100. For example, the storage device 200 may output data stored in the NVM based on the read command from the host 100, may write data to the NVM based on the write command from the host 100, and may erase data stored in the NVM based on the erase command from the host 100.

The storage device 200 may include a plurality of banks, each of the banks may include a plurality of blocks, and each of the blocks may include a plurality of memory cell arrays to store data. The host 100 may transmit the write command and the erase command to different blocks, respectively. For example, the host 100 may command the storage device 200 to perform a write operation on a first block of a first bank among the banks and an erase operation on a second block of the first bank. Accordingly, the storage device 200 may schedule a task to perform the write operation on the first block and the erase operation on the second block.

The storage device 200 may include a splitter 210 for managing the erase operation. The splitter 210 may schedule the erase operation. For example, the splitter 210 may generate an erase start signal and an erase stop signal for the erase operation. The erase start signal is a signal commanding erasure of data stored in the NVM, and may designate a block to be erased in the NVM. The erase stop signal may be a signal commanding to stop the erase operation of the NVM. The splitter 210 may transmit a generated signal to the NVM, and the NVM may perform the erase operation in response to the signal. That is, the NVM of the storage device 200 may initiate the erase operation for a block in response to the erase start signal. The NVM may perform the erase operation until the erase stop signal is received.

The splitter 210 may generate a signal to perform the erase operation while the storage device 200 performs the write operation. For example, the splitter 210 may output the erase start signal when the write operation ends earlier than a reference time. The write operation may be performed in units of word lines of blocks. That is, the storage device 200 may perform writing in units of word lines, and the splitter 210 may output the erase start signal when the write operation on one word line ends earlier than a reference time. The splitter 210 may output the erase stop signal when the reference time is reached. As such, the splitter 210 may check a write time of all word lines of a block, and may output the erase start signal and the erase stop signal if the write time is shorter than the reference time.

In an embodiment, the reference time may be a longest write time among a plurality of write times required for the block. For example, a block may include a plurality of word lines, and write times for each of the word lines may be different. The splitter 210 may determine the longest write time among the write times of the word lines as the reference time. For example, the splitter 210 may obtain the longest write time in advance through a manufacturer specification. That is, the splitter 210 may pre-determine a reference time prior to the write operation.

In an embodiment, the splitter 210 may schedule a task such that an erase operation of a second block is completed during the write operation of the first block. The first block may include a plurality of word lines. The word lines may include a first word line having the longest write time and second word lines other than the first word line. The storage device 200 may determine the write time of the first word line as the reference time. The storage device 200 may transmit a write completion signal (or response signal) to the host 100 based on the reference time. That is, although an actual time required for the storage device 200 to perform the write operation on each of the word lines in the first block is different, the host 100 may determine that the word lines operate normally and consistently based on the reference time. Accordingly, quality of service (QOS) of the storage device 200 may be improved.

When performing the write operation on the second word lines excluding the first word line among the word lines, the storage device 200 may complete the write operation within the reference time, and may remain in an idle state for a remaining time. The storage device 200 may perform an erase operation of the second block in the remaining time. That is, the storage device 200 may perform the erase operation when the write time actually consumed for the word lines is shorter than the reference time. The splitter 210 may output the erase start signal during the remaining time. The splitter 210 may output the erase stop signal when the reference time is reached. As such, the storage device 200 may perform the erase operation of the second block during the write operation of the first block due to the operation of the splitter 210, and thus input/output (I/O) latency due to the erase operation of the second block may be hidden by the write operation of the first block. When the erase operation of the second block is completed, the storage device 200 may report erase completion to the host 100.

In an embodiment, the storage device 200 may require a minimum time for an erase operation. The splitter 210 may compare the minimum time and the remaining time. The splitter 210 may output the erase start signal when the remaining time is longer than the minimum time. The splitter 210 may not output an erase start signal when the remaining time is smaller than or equal to the minimum time.

In an embodiment, the splitter 210 may evenly divide an entire erase time. The splitter 210 may compare the divided erase time with the remaining time. The splitter 210 may output an erase start signal when the remaining time is longer than the divided erase time. The splitter 210 may not output the erase start signal when the remaining time is smaller than or equal to the divided erase time.

In an embodiment, the splitter 210 may divide the entire erase time in proportion to the remaining time. For example, the splitter 210 may allocate a longer erase time when the remaining time is relatively longer than an erase time when the remaining time is relatively short. The splitter 210 may allocate an erase time by adjusting the interval between a transmission time of the erase start signal and a transmission time of the erase stop signal. In this case, the entire erase time may be non-uniformly divided.

In an embodiment, when an erase operation of the second block is not completed during the write operation of the first block, the splitter 210 may complete a remaining erase operation of the second block after the operation of the first block is completed. In a conventional storage device, the entire erase operation of the second block was performed after the write operation of the first block. By contrast, the storage device 200 according to an embodiment performs a remaining erase operation of the second block after the write operation of the first block, and thus the host 100 may recognize that the time required for the erase operation is shortened.

In an embodiment, when an erase operation of the second block is not completed during the write operation of the first block, the splitter 210 may complete the remaining erase operation of the second block during a write operation to a third block subsequent to the operation to the first block. In a conventional storage device, the entire erase operation of the second block was performed after the write operation of the first block. By contrast, the storage device 200 according to an embodiment performs the erase operation of the second block during the write operation of the first block and the write operation of the third block, and thus I/O latency due to the erase operation of the second block may be hidden by the write operation of the first block.

In addition, the storage device 200 may further include a controller and a memory. A controller of the storage device 200 may include an intellectual property (IP) circuit designed to implement an application specific integrated circuit (ASIC) and/or a field-programmable gate array (FPGA). According to another embodiment, the controller of the storage device 200 may be implemented to support Compute Express Link (CXL) protocol (e.g., CXL 2.0 protocol, CXL 3.0 protocol, or any other version). The controller of the storage device 200 may convert CXL packets and signals of a memory interface of a memory connected to the host 100 to each other.

In an embodiment, the splitter 210 may be positioned inside the controller of the storage device 200. In an embodiment, the splitter 210 may be positioned outside the controller of the storage device 200. In an embodiment, the splitter 210 may be implemented as firmware or software to be executed by a controller of the storage device 200.

A memory of the storage device 200 may include a volatile memory and an NVM. The memory of the storage device 200 may include one of a dynamic random-access memory (DRAM), a not-and (NAND) flash, a high bandwidth memory (HBM), a hybrid memory cube (HMC), a dual in-line memory module (DIMM), an Optane DIMM, an non-volatile DIMM (NVMDIMM), a double data rate (DDR) synchronous DRAM, and a low-power double data rate synchronous DRAM, or a combination thereof. In an embodiment, the memory of the storage device 200 may operate as a cache buffer of the storage device 200. That is, the storage device 200 may use the memory as a cache buffer.

Figure 2:
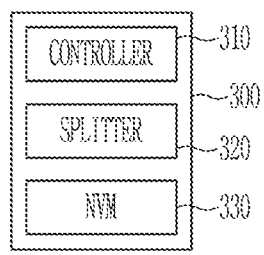
FIG. 2 illustrates a block diagram of a storage device according to an embodiment.

FIG. 2 illustrates a block diagram of a storage device according to an embodiment.

Referring to FIG. 2, the storage device 300 according to an embodiment may include a controller 310, a splitter 320, and a NVM 330.

The controller 310 may control an overall operation of the storage device 300. The controller 310 may transmit a signal to the splitter 320 based on a command from the host. For example, the controller 310 may transmit a signal to the splitter 320 in response to a write command from the host. The description of the splitter 210 made with reference to FIG. 1 may be applied to the splitter 320 in a same manner. The controller 310 may control the NVM 330 based on a command from the host. For example, the controller 310 may write data to the NVM 330, may read data from the NVM 330, or may erase data from the NVM 330. That is, the NVM 330 may perform an operation based on control of the controller 310.

The NVM 330 may operate based on a signal of the controller 310 and a signal of the splitter 320. In an embodiment, when the command of the host is the write command, the controller 310 may transmit a signal corresponding to the write command to the NVM 330. The NVM 330 may perform a write operation in response to a signal from the controller 310, and may transmit a completion signal to the controller 310 when the write operation is completed. The NVM 330 may perform the write operation in units of word lines, and may transmit a completion signal to the controller 310 for each of the word lines. The controller 310 may determine a remaining time based on the completion signal. The controller 310 may transmit the remaining time to the splitter 320. The splitter 320 may transmit an erase start signal to the NVM 330 based on the remaining time.

According to an embodiment, the NVM 330 may complete the write operation, and may transmit a completion signal to the splitter 320. In an embodiment, the NVM 330 may transmit a write start time and a write completion time to the splitter 320. The splitter 320 may calculate the remaining time based on the reference time, the write start time, and the write completion time. In an embodiment, the NVM 330 may complete the write operation, and may calculate the remaining time. The NVM 330 may transfer the remaining time to the splitter 320.

In an embodiment, when the command of the host is the write command, the controller 310 may transmit a signal corresponding to the write command to the splitter 320 and the NVM 330. The NVM 330 may perform a write operation in response to a signal from the controller 310, and the splitter 320 may obtain a write start time of the NVM 330 based on a signal from the controller 310. The NVM 330 may complete the write operation, and may transmit a completion signal to the controller 310 and splitter 320. The NVM 330 may perform the write operation in units of word lines, and may transmit a completion signal to the controller 310 and the splitter 320 for each of the word lines. The splitter 320 may determine the remaining time based on the writing start time and the completion signal. The splitter 320 may transmit an erase start signal to the NVM 330 based on the remaining time.

Figure 3:
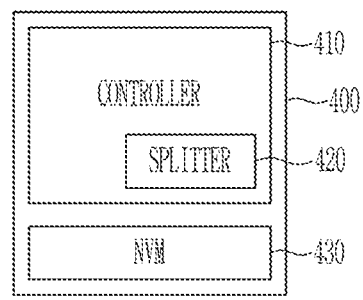
FIG. 3 illustrates a block diagram of a storage device according to an embodiment.

FIG. 3 illustrates a block diagram of a storage device according to an embodiment.

Referring to FIG. 3, a storage device 400 according to an embodiment may include a controller 410 and a NVM 430.

The controller 410 may control an overall operation of the storage device 400. The controller 410 may control the NVM 430 based on a command from the host. For example, the controller 410 may write data to the NVM 430, may read data from the NVM 430, or may erase data from the NVM 330. That is, the NVM 430 may perform an operation based on control of the controller 410.

The controller 410 includes a splitter 420, and the description of the splitter 210 made with reference to FIG. 1 may be applied to the splitter 420 in a same manner. When the controller 410 receives the write command from the host, the splitter 420 may obtain the write start time of the NVM 430 based on the write command.

In an embodiment, when the command of the host is the write command, the controller 410 may transmit a signal corresponding to the write command to the NVM 430. The NVM 430 may perform a write operation in response to a signal from the controller 410, and may transmit a completion signal to the controller 410 when the write operation is completed. The NVM 430 may perform the write operation in units of word lines, and may transmit a completion signal to the controller 410 for each of the word lines. When the controller 410 receives the completion signal, the splitter 420 may determine the remaining time based on the completion signal. The splitter 420 may transmit an erase start signal to the NVM 430 based on the remaining time.

In an embodiment, the NVM 430 may complete the write operation, and may calculate the remaining time. The NVM 430 may transfer the remaining time to the splitter 420. The splitter 420 may transmit an erase start signal to the NVM 430 based on the remaining time.

Although the controller 410 and the splitter 420 in FIG. 3 have been described as performing individual operations, the present disclosure is not necessarily limited thereto, and all operations of the splitter 420 may be implemented by the controller 410.

Figure 4:
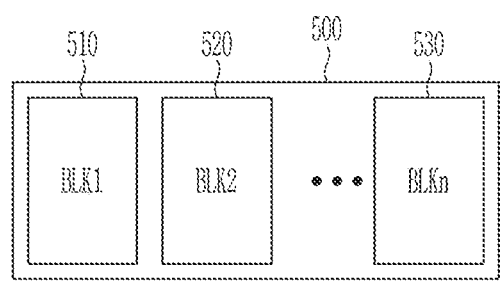
FIG. 4 illustrates a block diagram of a NVM according to an embodiment.

FIG. 4 illustrates a block diagram of a NVM according to an embodiment.

Referring to FIG. 4, a NVM 500 according to an embodiment may include a plurality of blocks BLK1 to BLKn and 510 to 530. Each of the blocks 510 to 530 may include a plurality of memory cell arrays to store data.

The NVM 500 may be included in a storage device, and may operate based on a command of the host. For example, the host may command a write operation to a first block 510 and an erase operation to a second block 520.

The NVM 500 may receive an erase start signal during a write operation of the first block 510. The NVM 500 may be in an idle state during the write operation of the first block 510. The NVM 500 may receive an erase start signal in the idle state. The NVM 500 may perform an erase operation on the second block 520 in response to the erase start signal. The NVM 500 may receive an erase stop signal during an erase operation. The NVM 500 may stop the erase operation for the second block 520 in response to the erase stop signal. That is, the NVM 500 may perform the erase operation on the second block 520 between a time when the erase start signal is received and a time when the erase stop signal is received. The NVM 500 may receive the erase start signal and the erase stop signal from a splitter of a storage device.

The NVM 500 may complete an erase operation of the second block 520 during the write operation of the first block 510. According to an embodiment, when the erase operation of the second block 520 is not completed during the write operation of the first block 510, the NVM 500 may finish the remaining erase operation after the write operation of the first block 510 is completed, or may perform the remaining erase operation during the write operation of a subsequent block (e.g., the third block).

Figure 5:
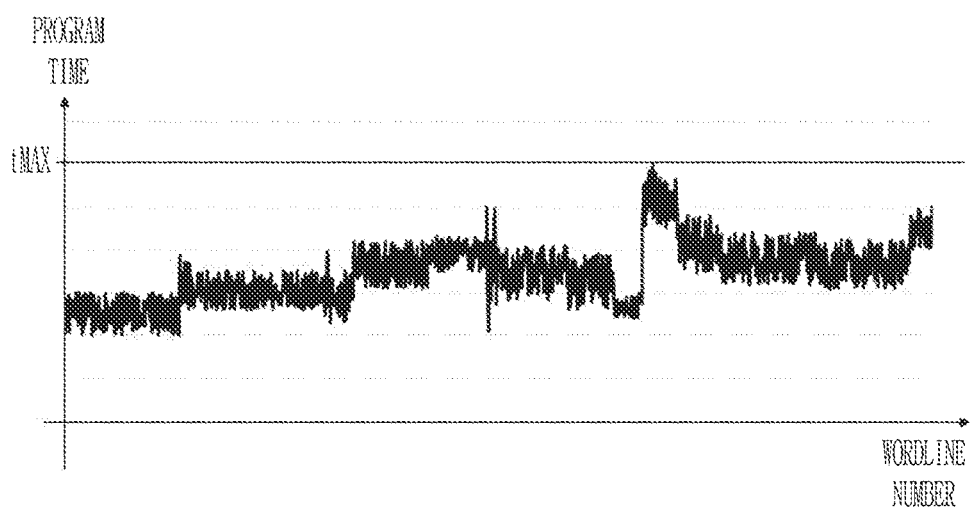
FIG. 5 illustrates a graph showing a program time for each word line according to an embodiment.

FIG. 5 illustrates a graph showing a program time for each word line according to an embodiment.

Referring to FIG. 5, it is possible to check a time required for each word line when data is written (recorded or programmed) in a NVM of a storage device. A data write time for each word line may be determined in advance according to a manufacturer specification. In the graph, an x-axis represents a number of a plurality of word lines included in one block, and a y-axis represents the actual time spent writing data for each word line.

A time required to write data for each word line may be different. A time tMAX may be a longest time among times required to write data of the word lines. The time tMAX may be determined as a reference time. That is, although an actual time required for the storage device to perform the write operation on each of the word lines is different, the host may determine that the word lines operate normally and consistently based on the reference time. Accordingly, service of quality (QoS) of the storage device may be improved.

The time tMAX may be required when the storage device writes data to a first word line among the word lines. It may take a time shorter than the time tMAX to write data to second word lines excluding the first word line among the word lines. That is, when the storage device writes data to the second word lines, there may be a remaining time remaining in an idle state after writing is completed. The storage device may perform a data erase operation in the remaining time. In this case, in the NVM, a block in which data is written and a block in which data is erased may be different. For example, the host may issue a write command to the first block of the NVM and an erase command to the second block. The NVM may perform the erase operation on the second block during the write operation on the first block.

FIG. 6 to FIG. 9 each illustrate a view of an operation of a storage device according to an embodiment.

Figure 6:
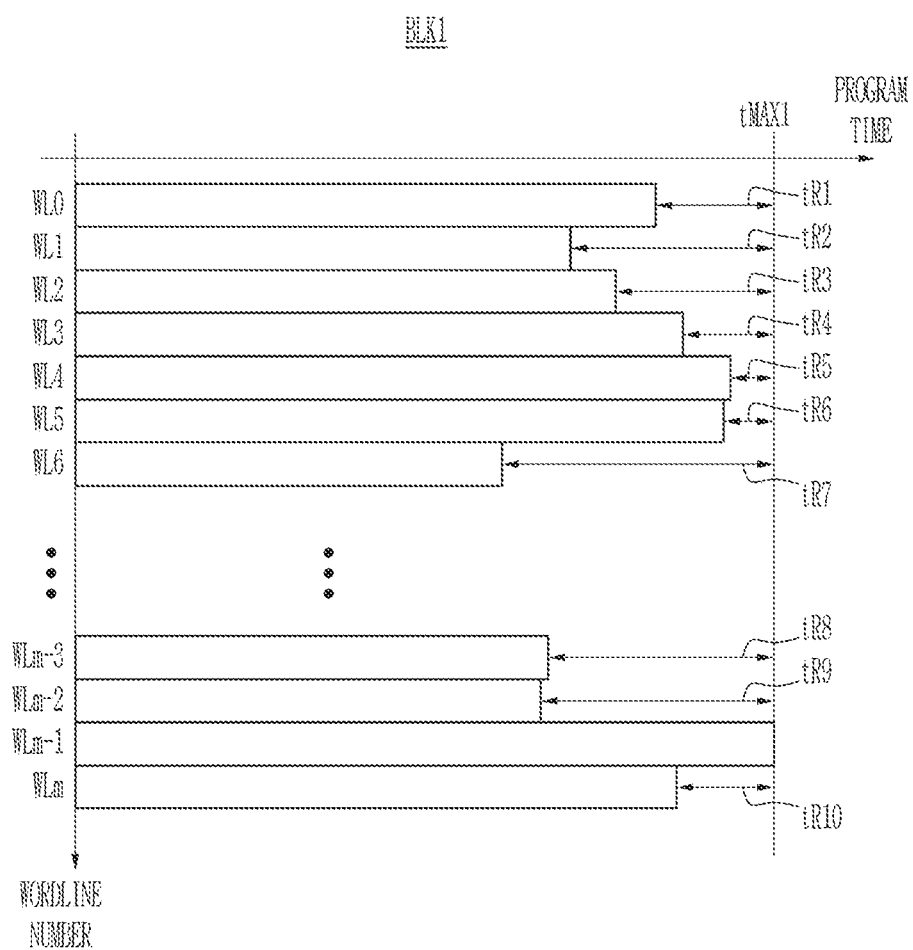
FIG. 6 illustrates a view of an operation of a storage device according to an embodiment.

Referring to FIG. 6, a NVM of a storage device may include a plurality of blocks. Among the blocks, a first block BLK1 may include a plurality of word lines WL0 to WLm. Herein, m may be an integer of 10 or greater. In FIG. 6, the y-axis represents a number of a plurality of word lines included in the first block BLK1, and the x-axis represents the actual time required to write data for each of the word lines.

Times required when the storage device writes data to the word lines WL0 to WLm may be different. For example, when writing data to the word lines WL0 to WLm, the storage device may take the longest time tMAX1 to a word line WLm. The storage device may determine the time tMAX1 as a reference time of the first block BLK1. Remaining times tR1 to tR10 may exist during the write operation of the word lines WL0 to WL6, WLm−3, WLm−2, and WLm excluding the word line WLm−1 among the word lines WL0 to WLm, The remaining times tR1 to tR10 may represent a time from the time when the storage device completes writing data to the word lines WL0 to WL6, WLm−3, WLm−2, and WLm to the reference time. For example, when the storage device completes writing data to the word line WL0, there is a remaining time tR1 until the reference time in the write operation of the word line WL0. Similarly, when data writing is completed on each of the word lines WL1 to WMm, there may be remaining times tR2 to tR10 until the reference time in the write operation of each of the word lines WL1 to WMm.

Figure 7:
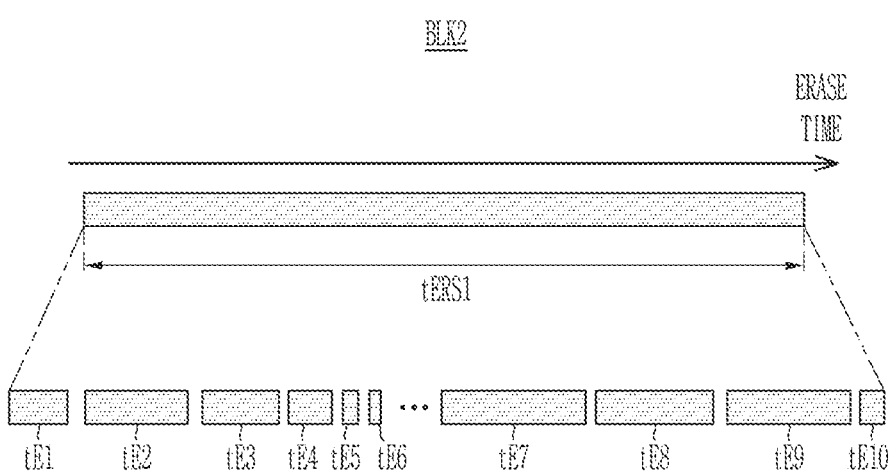
FIG. 7 illustrates a view of an operation of a storage device according to an embodiment.

Referring to FIGS. 6 and 7, the storage device may perform the erase operation on the second block BLK2 among the blocks during the remaining times tR1 to tR10. The host may command the storage device to write data to the first block BLK1 and to erase data to the second block BLK2. The storage device may distribute and perform the erase operation on the second block BLK2 during the remaining times tR1 to tR10 while performing the write operation on the first block BLK1. For example, it may take a time tERS1 when the storage device erases data of the second block BLK2. The storage device may divide the erase operation into a plurality of partial erase operations, and may perform each of the plurality of partial erase operations during each time tE1 to tE10. The storage device may divide the time tERS1 to perform the partial erase operations during the remaining times tR1 to tR10. The storage device may determine the times tE1 to tE10 based on the remaining times tR1 to tR10 during the write operation of the first block BLK1. Each of the times tE1 to tE10 may be smaller than each of the remaining times tR1 to tR10. A total sum of the times tE1 to tE10 may be substantially equal to the time tERS1.

Figure 8:
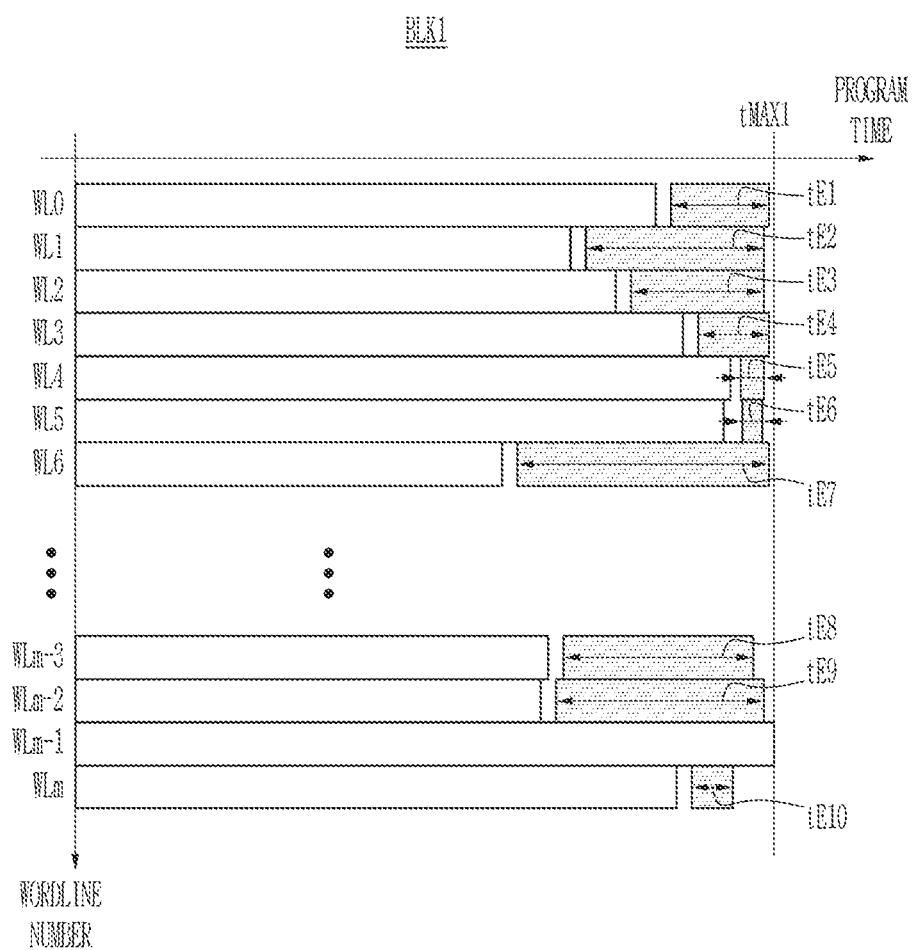
FIG. 8 illustrates a view of an operation of a storage device according to an embodiment.
Figure 9:
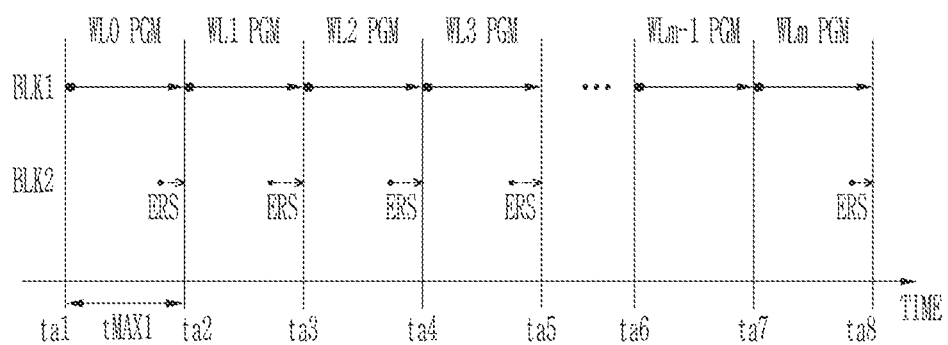
FIG. 9 illustrates a view of an operation of a storage device according to an embodiment.

Referring to FIGS. 6-8, the storage device may schedule a task such that the erase operation of the second block BLK2 is completed during the write operation of the first block BLK1. For example, when the write operation on the word line WL0 of the first block BLK1 is completed, the storage device may perform a partial erase operation during the time tE1 in the remaining time tR1. Similarly, when the storage device completes a write operation for each of the word lines WL1 to WLm, a partial erase operation may be performed for each of the remaining times tR2 to tR10 for each of the times tE2 to tE10. As such, the storage device may perform a partial erase operation during each of the times tE1 to tE10 included in each of the remaining times tR1 to tR10, thereby erasing all data of the second block BLK2.

Referring to FIGS. 6-9, a configuration in which the storage device performs the write operation on a first block BLK1 and an erase operation on the second block BLK2 is illustrated. The storage device may allocate a write time WL0 PGM of the word line WL0 of the first block BLK1 from a time ta1 to a time ta2. The time allocated by the storage device may correspond to a reference time. The storage device may allocate the same reference time to the word lines WL0 to WLm of the first block BLK1. The reference time may correspond to a time tMAX1 actually required to write the word line WL(m−1) among the word lines WL0 to WLm of the first block BLK1. The time tMAX1 actually taken to write the word line WL(m−1) may be the longest among a plurality of times actually taken to write the word lines WL0 to WLm. That is, same write times WL1 PGM to WLm PGM as the write time WL0 PGM may be allocated to the first to m-th word lines WL1 to WLm. When data writing is completed on the word line WL0 within the allotted time tMAX1, the storage device may initiate data erasure ERS of the second block BLK2. The storage device may perform data erasure ERS until the time ta2.

Similarly, the storage device may write data to the word line WL1 of the first block BLK1 from time ta2 to a time ta3, and may perform data erasure ERS of second block BLK2 during the remaining time. The storage device may write data to the word line WL2 of the first block BLK1 from the time ta3 to a time ta4, and may perform data erasure ERS of second block BLK2 during the remaining time. The storage device may write data to the word line WL3 of the first block BLK1 from the time ta4 to a time ta5, and may perform data erasure ERS of second block BLK2 during the remaining time. The storage device may write data on the word line WL(m−1) of the first block BLK1 from a time ta6 to a time ta7. Since there is no remaining time from the time ta6 to the time ta7, the storage device may not perform the erase operation. The storage device may write data to the word line WL of the first block BLK1 from the time ta7 to a time ta8, and may perform data erasure ERS of second block BLK2 during the remaining time. As such, the storage device may perform the erase operation on the second block BLK2 during the write operation on the first block BLK1, and thus input/output (I/O) latency due to the erase operation of the second block BLK2 may be hidden by the write operation of the first block BLK1.

FIG. 10 to FIG. 13 each illustrate a view of an operation of a storage device according to an embodiment.

Figure 10:
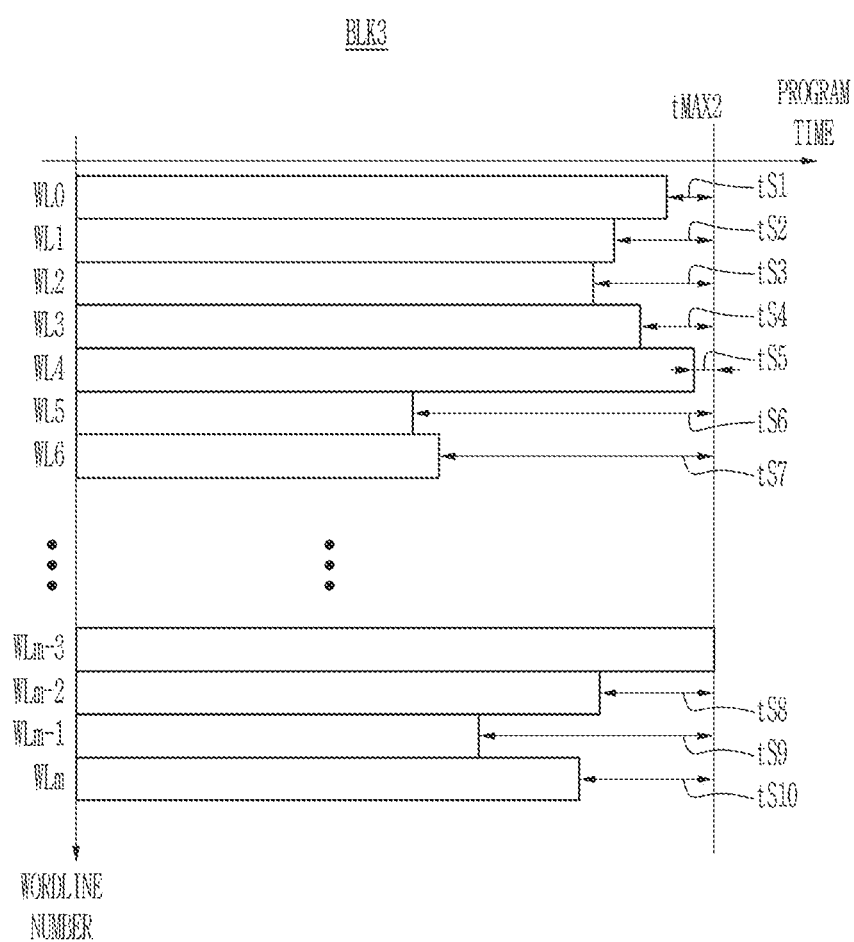
FIG. 10 illustrates a view of an operation of a storage device according to an embodiment.

Referring to FIG. 10, a NVM of a storage device may include a plurality of blocks. Among the blocks, a third block BLK3 may include the word lines WL0 to WLm. Herein, m may be an integer of 10 or greater. In FIG. 10, the y-axis represents a number of a plurality of word lines included in the third block BLK3, and the x-axis represents the actual time required to write data for each of the word lines.

Times required when the storage device writes data to the word lines WL0 to WLm may be different. For example, when writing data to the word lines WL0 to WLm, the storage device may take the longest time tMAX2 to a word line WLm−3. The storage device may determine the time tMAX2 as a reference time of the second block BLK2. Remaining times tS1 to tS10 may exist during the write operation of the word lines WL0 to WL6 and WL(m−2) to WLm excluding the word line WL(m−3) among the word lines WL0 to WLm.

The remaining times tS1 to tS10 may represent a time from the time when the storage device completes writing data to the word lines WL0 to WL6 and WL(m−2) to WLm to the reference time. For example, when the storage device completes writing data to the word line WL0, there is a remaining time tS1 until the reference time in the write operation of the word line WL0. Similarly, when data writing is completed on each of the word lines WL1 to WLm, there may be remaining times tS2 to tS10 until the reference time in the write operation of each of the word lines WL1 to WMm.

Figure 11:
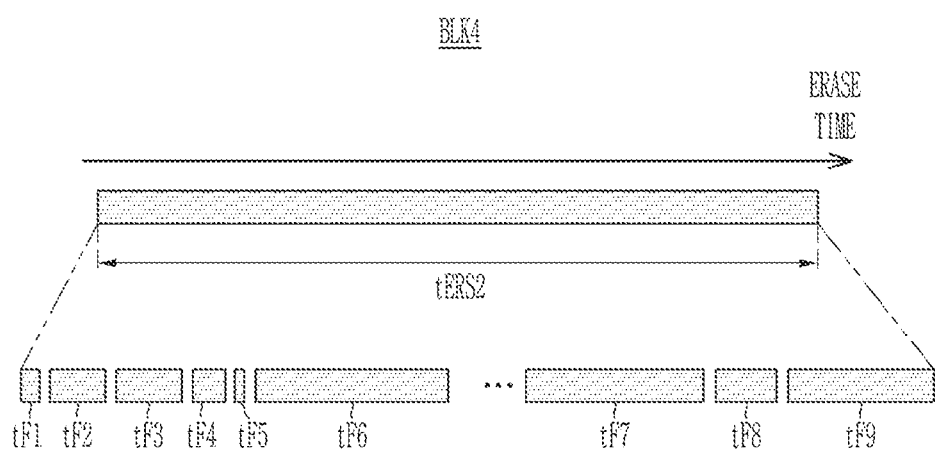
FIG. 11 illustrates a view of an operation of a storage device according to an embodiment.

Referring to FIGS. 10 and 11, the storage device may perform the erase operation on the fourth block BLK4 among the blocks during the remaining times tS1 to tS10. The host may command the storage device to write data to the third block BLK3 and to erase data to the fourth block BLK4. The storage device may divide and perform the erase operation on the fourth block BLK4 during the remaining times tS1 to tS10 while performing the write operation on the third block BLK3. For example, it may take a time tERS2 when the storage device erases data of the fourth block BLK4. The storage device may divide the erase operation into a plurality of partial erase operations, and may perform each of the plurality of partial erase operations during each time tF1 to tF9. The storage device may divide the time tERS2 to perform the partial erase operations during the remaining times tS1 to tS10. The storage device may determine the times tF1 to tF9 based on the remaining times during the write operation of the third block BLK3. Each of the times tF1 to tF9 may be smaller than a remaining time for the corresponding word line. A total sum of the times tF1 to tF9 may be substantially equal to the time tERS2.

Figure 12:
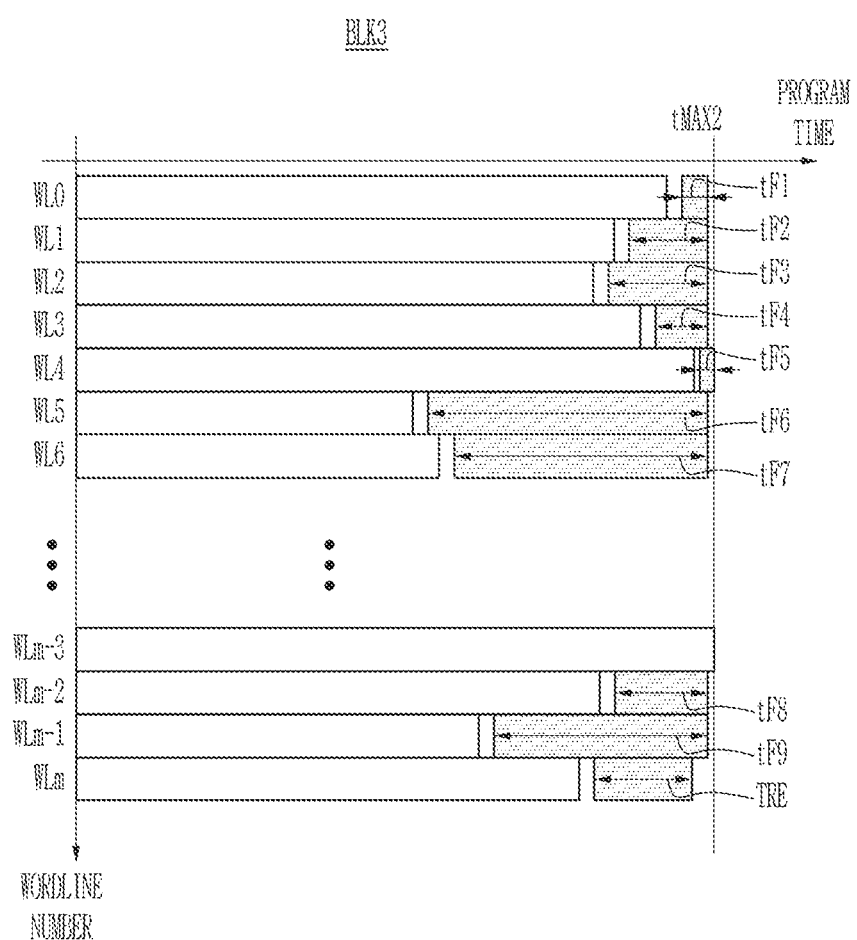
FIG. 12 illustrates a view of an operation of a storage device according to an embodiment.
Figure 13:
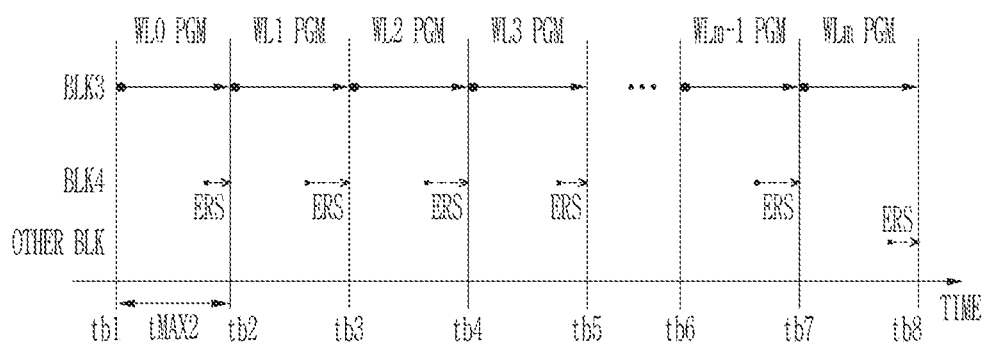
FIG. 13 illustrates a view of an operation of a storage device according to an embodiment.

Referring to FIGS. 10-12, the storage device may schedule a task such that the erase operation of the fourth block BLK4 is completed during the write operation of the third block BLK3. For example, when the write operation on the word line WL0 of the third block BLK3 is completed, the storage device may perform a partial erase operation during the time tF1 in the remaining time tS1. Similarly, when the storage device completes a write operation for each of the word lines WL1 to WLm, a partial erase operation may be performed for each of the remaining times tS2 to tS9 for each of the times tF2 to tF9. As such, the storage device may perform a partial erase operation during each of the times tF1 to tF9 included in each of the remaining times tS1 to tS9, thereby erasing all data of the fourth block BLK4.

The storage device may complete the erase operation on the fourth block BLK4 when the write operation on the word line WL(m−1) of the third block BLK3 is completed. That is, when the storage device completes writing data on the word line WLm, the erase operation on the fourth block BLK4 may not be performed for a remaining time tS10. In an embodiment, the storage device may start an erase operation on a next erase target block during a time TRE in the remaining time tS10. The next erase target block may be designated by the host. In an embodiment, the storage device may be in an idle state for the remaining time tS10.

Referring to FIGS. 10-13, a configuration in which the storage device performs the write operation on a third block BLK3 and an erase operation on the fourth block BLK4 is illustrated. The storage device may allocate a write time WL0 PGM of the word line WL0 of the third block BLK3 from a time tb1 to a time tb2. The time allocated by the storage device may correspond to a reference time. The storage device may allocate the same reference time to the word lines WL0 to WLm of the third block BLK3. The reference time may correspond to a time tMAX2 actually required to write the word line WL(m−3) among the word lines WL0 to WLm of the third block BLK3. The time tMAX2 actually taken to write the word line WL(m−3) may be the longest among a plurality of times actually taken to write the word lines WL0 to WLm. That is, same write times WL1 PGM to WLm PGM as the write time WL0 PGM may be allocated to the first to m-th word lines WL1 to WLm. When data writing is completed on the word line WL0 within the allotted time tMAX2, the storage device may initiate data erasure ERS of the fourth block BLK4. The storage device may perform data erasure ERS until the time tb2.

Similarly, the storage device may write data to the word line WL1 of the third block BLK3 from time tb2 to a time tb3, and may perform data erasure ERS of the fourth block BLK4 during the remaining time. The storage device may write data to word line WL2 of the third block BLK3 from the time tb3 to a time tb4, and may perform data erasure ERS of the fourth block BLK4 during the remaining time. The storage device may write data to word line WL3 of the third block BLK3 from the time tb4 to a time tb5, and may perform data erasure ERS of the fourth block BLK4 during the remaining time. The storage device may write data to the word line WL(m−1) of the third block BLK3 from the time tb6 to a time tb7, and may perform data erasure ERS of the fourth block BLK4 during the remaining time. As such, the storage device may perform the erase operation on the fourth block BLK4 during the write operation on the third block BLK3, and thus I/O latency due to the erase operation of the fourth block BLK4 may be hidden by the write operation of the third block BLK3.

Meanwhile, the storage device erases all the data of the fourth block BLK4 at the time tb7, and thus the data of the fourth block BLK4 will not be erased for the remaining time from the time tb7 to a time tb8. In an embodiment, the storage device may perform data erasure ERS of another block subsequent to the fourth block BLK4 for the remaining time. In an embodiment, the storage device may be in an idle state for the remaining time.

FIG. 14 to FIG. 17 each illustrate a view of an operation of a storage device according to an embodiment.

Figure 14:
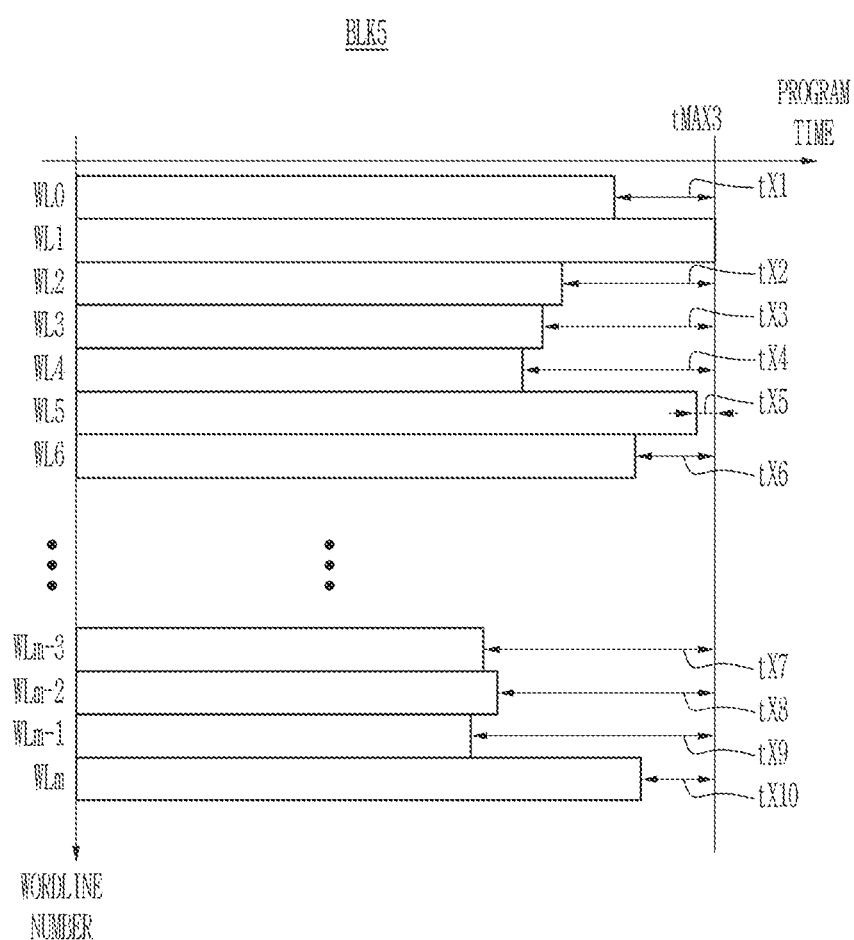
FIG. 14 illustrates a view of an operation of a storage device according to an embodiment.

Referring to FIG. 14, a NVM of a storage device may include a plurality of blocks. Among the blocks, a fifth block BLK5 may include the word lines WL0 to WLm. Herein, m may be an integer of 10 or greater. In FIG. 14, the y-axis represents a number of a plurality of word lines included in the fifth block BLK5, and the x-axis represents the actual time required to write data for each of the word lines.

Times required when the storage device writes data to the word lines WL0 to WLm may be different. For example, when writing data to the word lines WL0 to WLm, the storage device may take the longest time tMAX3 to the word line WL1. The storage device may determine the time tMAX3 as a reference time of the fifth block BLK5. Remaining times tX1 to tX10 may exist during the write operation of the word lines WL0 and WL2 to WLm other than the word line WL1 among the word lines WL0 to WLm.

The remaining times tX1 to tX10 may represent a time from the time when the storage device completes writing data to the word lines WL0 and WL2 to WLm to the reference time. For example, when the storage device completes writing data to the word line WL0, there is a remaining time tX1 until the reference time in the write operation of the word line WL0. Similarly, when data writing is completed on each of the word lines WL2 to WLm, there may be remaining times tX2 to tX10 until the reference time in the write operation of each of the word lines WL2 to WMm.

Figure 15:
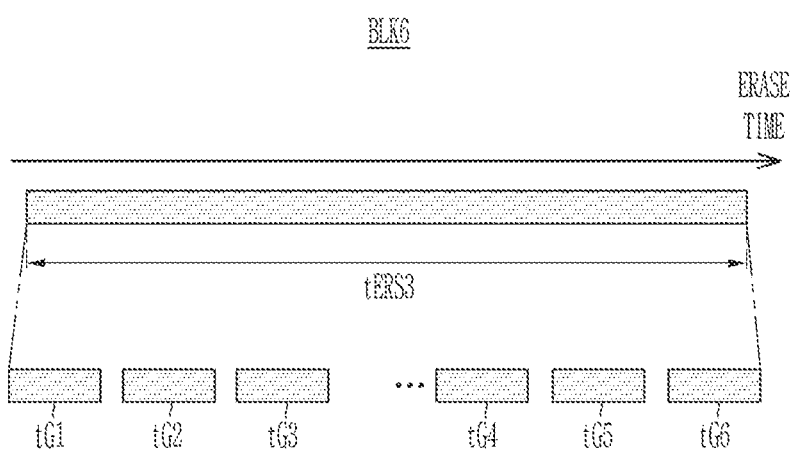
FIG. 15 illustrates a view of an operation of a storage device according to an embodiment.

Referring to FIGS. 14 and 15, the storage device may perform the erase operation on the sixth block BLK6 among the blocks during the remaining times tX1 to tX10. The host may command the storage device to write data to the fifth block BLK5 and to erase data to the sixth block BLK6. The storage device may divide and perform the erase operation on the sixth block BLK6 during the remaining times tX1 to tX10 while performing the write operation on the fifth block BLK5. For example, it may take a time tERS3 when the storage device erases data of the sixth block BLK6. The storage device may divide the erase operation into a plurality of partial erase operations, and may perform each of the plurality of partial erase operations during each time tG1 to tG6. The storage device may divide the time tERS3 to perform the partial erase operations during the remaining times tX1 to tX10. The storage device may evenly divide a time tERS3. That is, lengths of the times tG1 to tG6 may all be the same. The storage device may compare the remaining time during the write operation of the fifth block BLK5 with the times tG1 to tG6. The storage device may perform a partial erase operation when the remaining time is longer than the times tG1 to tG6. A total sum of the times tG1 to tG6 may be substantially equal to the time tERS3.

In an embodiment, the storage device may have a minimum time required for an erase operation. The storage device may evenly divide the time tERS3 such that the lengths of the times tG1 to tG6 are greater than or equal to a minimum time.

Figure 16:
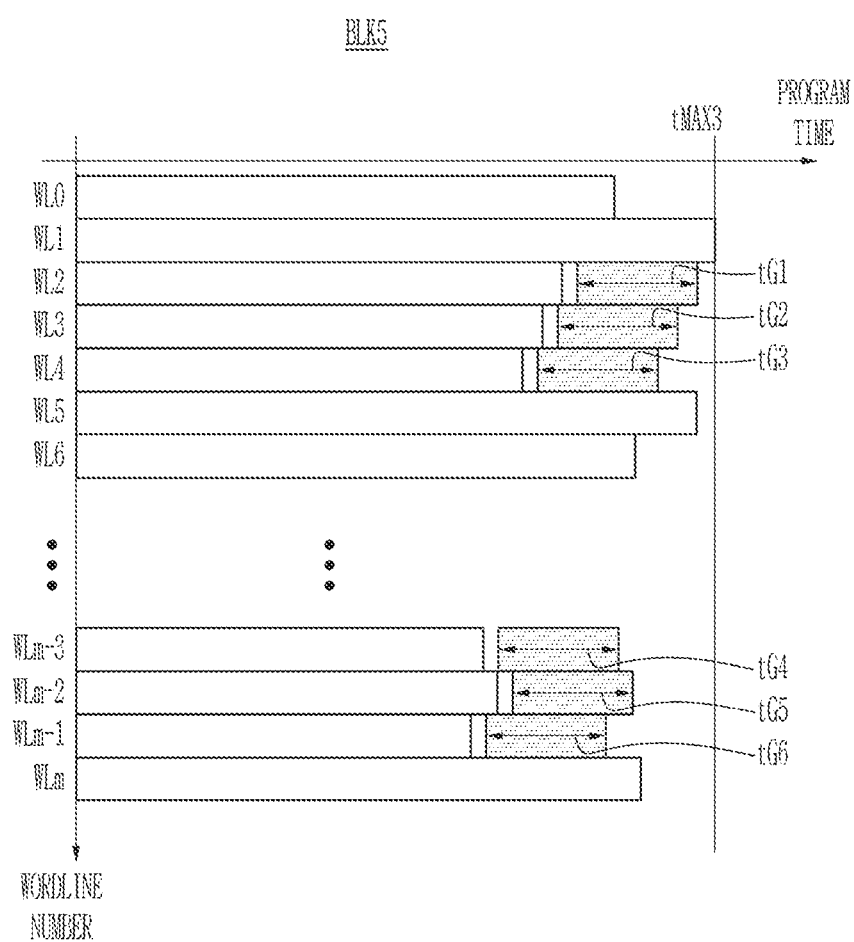
FIG. 16 illustrates a view of an operation of a storage device according to an embodiment.
Figure 17:
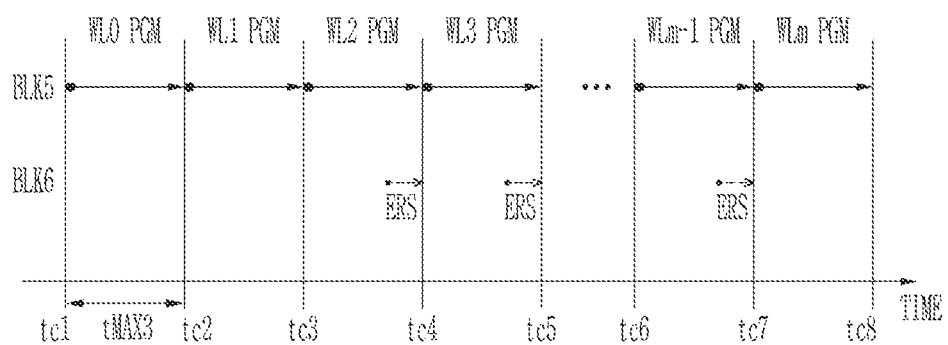
FIG. 17 illustrates a view of an operation of a storage device according to an embodiment.

Referring to FIGS. 14-16, the storage device may schedule a task such that the erase operation of the sixth block BLK6 is completed during the write operation of the fifth block BLK5. For example, when the write operation on the word line WL2 of the fifth block BLK5 is completed, the storage device may perform a partial erase operation during the time tG1 in the remaining time tX2. Similarly, the storage device may perform a partial erase operation for the time tG2 in the remaining time tX3 when the write operation to the word line WL3 is completed, may perform a partial erase operation during the time tG3 in the remaining time tX4 when the write operation to the word line WL4 is completed, may perform a partial erase operation for the time tG4 in the remaining time tX7 when the write operation to the word line WL(m−3) is completed, may perform a partial erase operation for the time tG5 in the remaining time tX8 when the write operation to the word line WL(m−2) is completed, and may perform a partial erase operation for the time tG6 in the remaining time tX9 when the write operation to the word line WL(m−1) is completed. The storage device may perform the partial erase operations for same times tG1 to tG6 of the remaining times tX2 to tX4 and tX7 to tX9. That is, the times tG1 to tG6 may be the same regardless of the lengths of the remaining times tX2 to tX4 and tX7 to tX9. As such, the storage device may erase all data of the sixth block BLK6 by performing the partial erase operations for the remaining time. The remaining times tX1, tX5, tX6, and tX10 of the word lines WL0, WL1, WL5, WL6, and WLm of the fifth block BLK5 are shorter than the times tG1 to tG6, and thus the storage device may not perform the partial erase operations for the remaining times tX1, tX5, tX6, and tX10.

Referring to FIGS. 14-17, a configuration in which the storage device performs the write operation on the fifth block BLK5 and an erase operation on the sixth block BLK6 is illustrated. The storage device may allocate a write time WL0 PGM of the word line WL0 of the fifth block BLK5 from a time tc1 to a time tc2. The time allocated by the storage device may correspond to a reference time. The storage device may allocate the same reference time to the word lines WL0 to WLm of the fifth block BLK5. The reference time may correspond to a time tMAX3 actually required to write the word line WL1 among the word lines WL0 to WLm of the fifth block BLK5. The time tMAX3 actually taken to write the word line WL1 may be the longest among a plurality of times actually taken to write the word lines WL0 to WLm. That is, same write times WL1 PGM to WLm PGM as the write time WL0 PGM may be allocated to the first to m-th word lines WL1 to WLm. The storage device may determine whether the remaining time within the allocated time tMAX3 is longer than the time required for the partial erase operation. The storage device may perform the partial erase operation when the remaining time is longer than the time required for the partial erase operation.

When data writing on the word line WL2 of the fifth block BLK5 is completed, the storage device may initiate data erasure ERS of the sixth block BLK6. The storage device may perform data erasure ERS until the time tc4. Similarly, the storage device may write data to the word line WL3 of the fifth block BLK5 from time tc4 to a time tc5, and may perform data erasure ERS of the sixth block BLK6 during the remaining time. The storage device may write data to the word line WL(m-1) of the fifth block BLK5 from the time tc6 to a time tc7, and may perform data erasure ERS of the sixth block BLK6 during the remaining time. As such, the storage device may perform the erase operation on the sixth block BLK6 during the write operation on the fifth block BLK5, and thus I/O latency due to the erase operation of the sixth block BLK6 may be hidden by the write operation of the fifth block BLK5.

When data is written to the word lines WL0, WL1, and WLm, the storage device may determine that the remaining time for each word line is shorter than the time required for the corresponding partial erase operation. Accordingly, the storage device may not perform the partial erase operations during the remaining times of the word lines WL0, WL1, and WLm.

FIG. 18 to FIG. 21 each illustrate a view of an operation of a storage device according to an embodiment.

Figure 18:
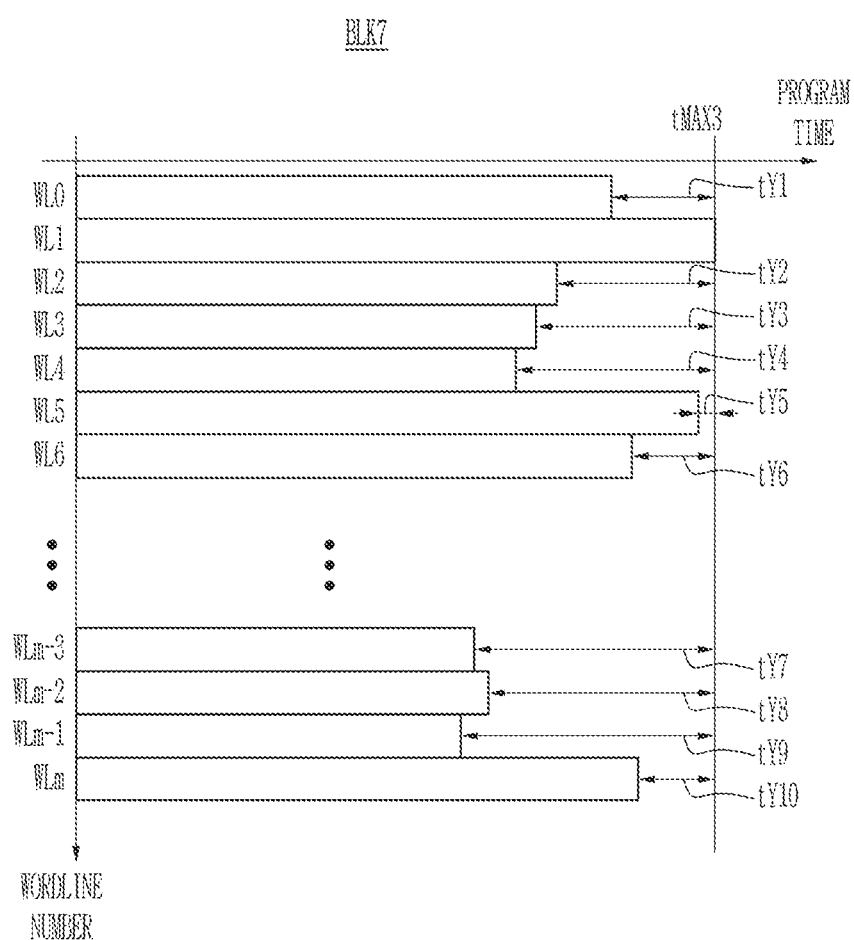
FIG. 18 illustrates a view of an operation of a storage device according to an embodiment.

Referring to FIG. 18, a NVM of a storage device may include a plurality of blocks. Among the blocks, a seventh block BLK7 may include the word lines WL0 to WLm. Herein, m may be an integer of 10 or greater. In FIG. 18, the y-axis represents a number of a plurality of word lines included in the seventh block BLK7, and the x-axis represents the actual time required to write data for each of the word lines.

Times required when the storage device writes data to the word lines WL0 to WLm may be different. For example, when writing data to the word lines WL0 to WLm, the storage device may take the longest time tMAX4 to the word line WL1. The storage device may determine the time tMAX4 as a reference time of the seventh block BLK7. Remaining times tY1 to tY10 may exist during the write operation of the word lines WL0 and WL2 to WLm other than the word line WL1 among the word lines WL0 to WLm. The remaining times tY1 to tY10 may represent a time from the time when the storage device completes writing data to the word lines WL0 and WL2 to WLm to the reference time.

For example, when the storage device completes writing data to the word line WL0, there is a remaining time tY1 until the reference time in the write operation of the word line WL0. Similarly, when data writing is completed on each of the word lines WL2 to WLm, there may be remaining times tY2 to tY10 until the reference time in the write operation of each of the word lines WL2 to WMm.

Figure 19:
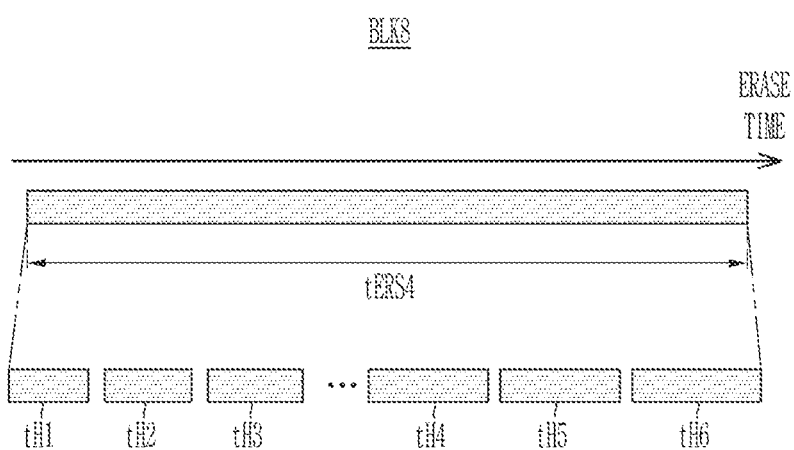
FIG. 19 illustrates a view of an operation of a storage device according to an embodiment.

Referring to FIGS. 18-19, the storage device may perform the erase operation on the eighth block BLK8 among the blocks during the remaining times tY1 to tY10. The host may command the storage device to write data to the seventh block BLK7 and to erase data to the eighth block BLK8. The storage device may divide and perform the erase operation on the eighth block BLK8 during the remaining times tY1 to tY10 while performing the write operation on the seventh block BLK7. For example, it may take a time tERS4 when the storage device erases data of the eighth block BLK8. The storage device may divide the erase operation into a plurality of partial erase operations, and may perform each of a plurality of partial erase operations during each time tH1 to tH6. The storage device may divide the time tERS4 to perform the partial erase operations during the remaining times tY1 to tY10.

The storage device may divide the time tERS4 based on the remaining time and the minimum time required for the erase operation. For example, the storage device may perform the partial erase operations when the remaining times tY1 to tY10 are longer than the minimum time. When performing the partial erase operations, the storage device may determine the partial erase operation times in proportion to the remaining times tY1 to tY10. The storage device may erase data of the eighth block BLK8 by dividing the time tERS4 based on the determined partial erase operation times. A total sum of the times tH1 to tH6 may be substantially equal to the time tERS4.

Figure 20:
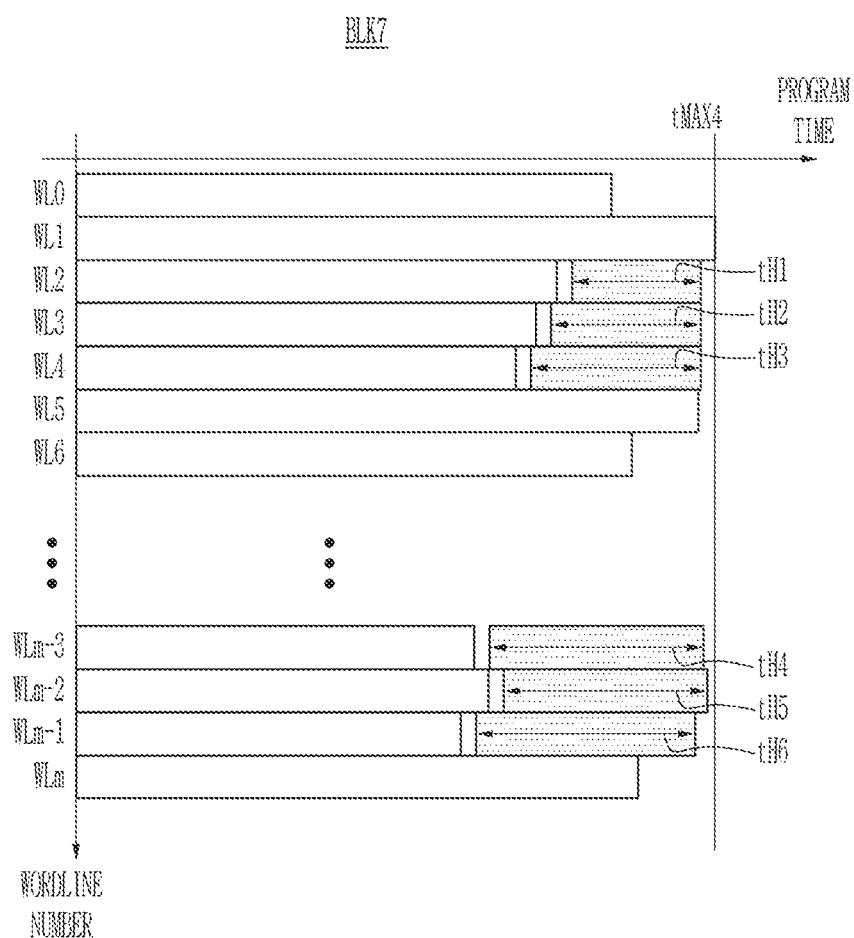
FIG. 20 illustrates a view of an operation of a storage device according to an embodiment.
Figure 21:
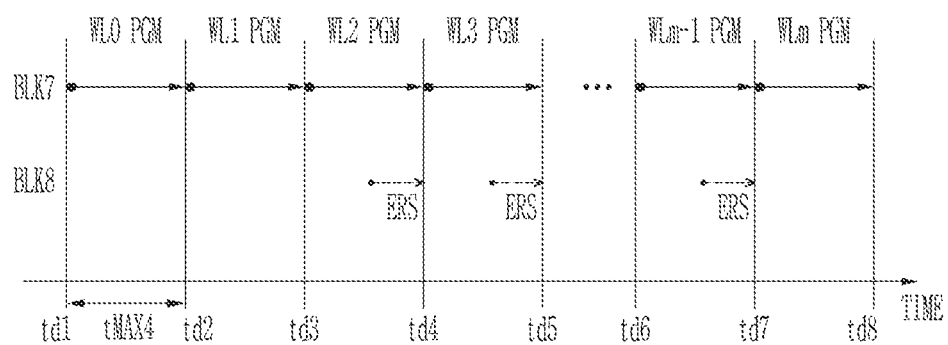
FIG. 21 illustrates a view of an operation of a storage device according to an embodiment.

Referring to FIGS. 18-20, the storage device may schedule a task such that the erase operation of the eighth block BLK8 is completed during the write operation of the seventh block BLK7. For example, when the write operation on the word line WL2 of the seventh block BLK7 is completed, the storage device may perform a partial erase operation during the time tH1 in the remaining time tY2. Similarly, the storage device may perform a partial erase operation for the time tH2 in the remaining time tY3 when the write operation to the word line WL3 is completed, may perform a partial erase operation during the time tH3 in the remaining time tY4 when the write operation to the word line WL4 is completed, may perform a partial erase operation for the time tH4 in the remaining time tY7 when the write operation to the word line WL(m-3) is completed, may perform a partial erase operation for the time tH5 in the remaining time tY8 when the write operation to the word line WL(m-2) is completed, and may perform a partial erase operation for the time tH6 in the remaining time tY9 when the write operation to the word line WL(m-1) is completed. The remaining times tY2 to tY4 and tY7 to tY9 may be longer than the minimum time required for the erase operation. The times tH1 to tH6 may be proportional to lengths of the remaining times tY2 to tY4 and tY7 to tY9. That is, the storage device may determine the times tH1 to tH6 by dividing the time tERS4 in proportion to the lengths of the remaining times tY2 to tY4 and tY7 to tY9. As such, the storage device may erase all data of the eighth block BLK8 by performing the partial erase operation for the remaining time. The remaining times tY1, tY5, tY6, and tY10 of the word lines WL0, WL1, WL5, WL6, and WLm of the seventh block BLK7 are shorter than the minimum time required for the corresponding erase operations, and thus the storage device may not perform the partial erase operation for the remaining times tY1, tY5, tY6, and tY10.

Referring to FIGS. 18-21, a configuration in which the storage device performs the write operation on the seventh block BLK7 and an erase operation on the eighth block BLK8 is illustrated. The storage device may allocate a write time WL0 PGM of the word line WL0 of the seventh block BLK7 from a time td1 to a time td2. The time allocated by the storage device may correspond to a reference time. The storage device may allocate the same reference time to the word lines WL0 to WLm of the seventh block BLK7. The reference time may correspond to a time tMAX4 actually required to write the word line WL1 among the word lines WL0 to WLm of the seventh block BLK7. The time tMAX4 actually taken to write the word line WL1 may be the longest among a plurality of times actually taken to write the word lines WL0 to WLm. That is, same write times WL1 PGM to WLm PGM as the write time WL0 PGM may be allocated to the first to $m^{th}$ word lines WL1 to WLm. The storage device may determine whether the remaining time within the allocated time tMAX4 is longer than the time required for the partial erase operation. The storage device may perform the partial erase operation when the remaining time is longer than the time required for the partial erase operation.

When data writing on the word line WL2 of the seventh block BLK7 is completed, the storage device may initiate data erasure ERS of the eighth block BLK8. The storage device may perform data erasure ERS until the time td4. Similarly, the storage device may write data to the word line WL3 of the seventh block BLK7 from time td4 to a time td5, and may perform data erasure ERS of the eighth block BLK8 during the remaining time. The storage device may write data to the word line WL(m−1) of the seventh block BLK7 from the time td6 to a time td7, and may perform data erasure ERS of the eighth block BLK8 during the remaining time. As such, the storage device may perform the erase operation on the eighth block BLK8 during the write operation on the seventh block BLK7, and thus I/O latency due to the erase operation of the eighth block BLK8 may be hidden by the write operation of the seventh block BLK7.

When data is written to the word lines WL0, WL1, and WLm, the storage device may determine that the remaining time for each word line is shorter than the time required for the corresponding partial erase operation. Accordingly, the storage device may not perform the partial erase operations during the remaining times of the word lines WL0, WL1, and WLm.

Figure 22:
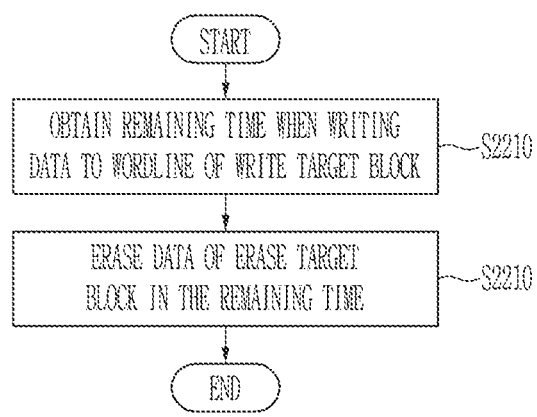
FIG. 22 illustrates a flowchart showing a memory control method according to an embodiment.

FIG. 22 illustrates a flowchart showing a memory control method according to an embodiment.

Referring to FIG. 22, a memory control method according to an embodiment may be performed by a storage device. A storage device may control an operation of a NVM included in the storage device.

The storage device may acquire a remaining time when writing data to a word line of a write target block (S2210). For example, the host may command writing data on a first block included in the NVM, and the storage device may write data on a word line of a first block. The storage device may determine a remaining time for each word line based on the reference time while data is being written to the word line of the first block. The storage device may pre-obtain a longest write time, and may determine the longest write time as a reference time. The storage device may determine the remaining time based on a time from each write time to the reference time.

The storage device may erase data of a block to be erased during the remaining time (S2220). For example, the host may command data erasure on the second block included in the NVM. The host may transmit a write command for the first block and an erase command for the second block to the storage device before the step S2220.

The storage device may divide the erase operation so that data erasing of the second block is completed when data writing of the first block is completed. In an embodiment, the storage device may divide the erase operation uniformly. In an embodiment, the storage device may divide the erase operation in proportion to the remaining time. In an embodiment, the storage device may divide the erase operation based on a minimum time for the erase operation. The storage device may compare the minimum time and remaining time, and may perform the erase operation according to a comparison result thereof. For example, the storage device may perform an erase operation when the remaining time is longer than the minimum time, and may not perform the erase operation when the remaining time is shorter than the minimum time.

The storage device may transmit an erase start signal and an erase stop signal to the NVM in order to erase data of the second block for the remaining time. That is, the NVM may start an erase operation in response to the erase start signal, and may stop the erase operation in response to the erase stop signal.

In an embodiment, when all data in the second block is erased, the storage device may perform the erase operation on the third block that is a block to be erased subsequent to the second block for the remaining time. In an embodiment, the storage device may be in an idle state for the remaining time after erasing all the data of the second block.

Figure 23:
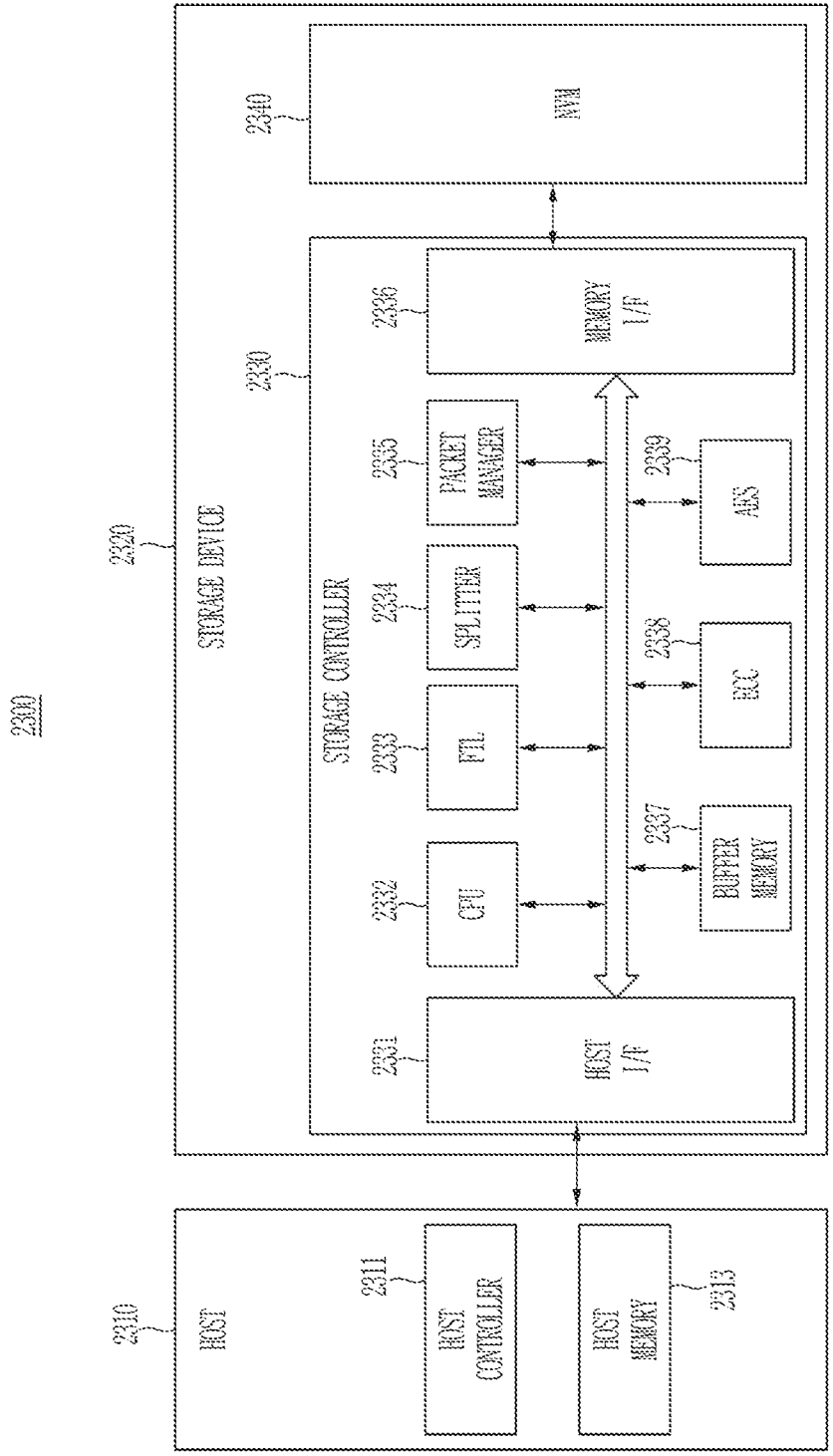
FIG. 23 illustrates a block diagram showing a computer system according to an embodiment.

FIG. 23 illustrates a block diagram showing a computer system according to an embodiment.

Referring to FIG. 23, the computer system 2300 may be a personal computer (PC), a laptop computer, a server, a media player, a digital camera, a navigation system, a black box, a vehicle electric device, and the like. Alternatively, the computer system 2300 may be a mobile system such as a portable communication terminal, a smart phone, a tablet PC, a wearable device, a healthcare device, or an Internet of things (IoT) device. In addition, the computer system 2300 may be implemented as a system-on-a-chip (SoC).

The computer system 2300 may include a host 2310 and a storage device 2320. The host 2310 may communicate with the storage device 2320 through various interfaces. The host 2310 may request a data processing operation, e.g., a data read operation, a data write (program) operation, and a data erase operation, from the storage device 2320. For example, the host 2310 may be a CPU, a GPU, an NPU, a TPU, a DPU, an AP, a microprocessor, or the like.

The host 2310 may include a host controller 2311 and a host memory 2313. The host memory 2313 may function as a buffer memory for temporarily storing data to be transmitted to the storage device 2320 or data transmitted from the storage device 2320.

The storage device 2320 may include a storage controller 2330 and a NVM 2340. The storage device 2320 may include storage media for storing data according to a request from the host 2310. For example, the storage device 2320 may be implemented in various types such as a solid-state drive (SSD), an embedded multi-media card eMMC, a universal flash storage (UFS), a compact flash (CF), a secure digital (SD) device, a micro-SD device, a mini-SD device, an extreme digital (xD) device, or a memory stick.

When the storage device 2320 is an SSD, the storage device 2320 may be a device conforming to the non-volatile memory express (NVMe) standard. When the storage device 2320 is an embedded memory or an external memory, the storage device 2320 may be a device conforming to the UFS standard or the eMMC standard. The host 2310 and the storage device 2320 may each generate, and may transmit, a packet according to an adopted standard protocol.

When the NVM 2340 of the storage device 2320 includes a flash memory, this flash memory may include a two-dimensional (2D) NAND memory array or a three-dimensional (3D) NAND memory array. As another example, the storage device 2320 may include other various types of NVMs. For example, various types of memory such as a magnetoresistive random-access memory (MRAM), a spin-transfer torque magnetic random-access memory (STT-RAM), a conductive bridging random-access memory (CBRAM), a ferroelectric (FeRAM), a phase-change random-access memory (PRAM), and a resistive random-access memory (RRAM) may be applied to the storage device 2320.

In some embodiments, the host controller 2311 and the host memory 2313 may be implemented as separate semiconductor chips. Alternatively, in some embodiments, the host controller 2311 and the host memory 2313 may be integrated on a same semiconductor chip. As an example, the host controller 2311 may be any one of a plurality of modules included in an AP, and such an AP may be implemented as an SoC. In addition, the host memory 2313 may be an embedded memory included in the AP, or may be a NVM or a memory module positioned outside the AP.

The host controller 2311 may manage an operation for storing data (e.g., write data) of the buffer area in the NVM 2340 or storing data (e.g., read data) of the NVM 2340 in the buffer area.

The storage controller 2330 may include a host interface 2331, a memory interface 2336, and a CPU 2332. In addition, the storage controller 2330 may further include a flash translation layer (FTL) 2333, a splitter 2334, a packet manager 2335, a buffer memory 2337, an error correction code (ECC) engine 2338, and an advanced encryption standard (AES) engine 2339.

The storage controller 2330 may further include a working memory into which the FTL 2333 is loaded, and when the CPU 2332 executes the flash conversion layer 2333, a data write operation and a read operation to the NVM may be controlled.

The host interface 2331 may transmit and receive packets to and from the host 2310. A packet transmitted from the host 2310 to the host interface 2331 may include a command or data to be written in the NVM 2340, and a packet transmitted from the host interface 2331 to the host 2310 may include a response to a command or data read from the NVM 2340.

The memory interface 2336 may transmit data to be written in the NVM 2340 to the NVM 2340, or may receive data read from the NVM 2340. This memory interface 2336 may be implemented to comply with a standard protocol such as Toggle or Open NAND Flash Interface (ONFI).

The flash conversion layer 2333 may perform various functions such as address mapping, wear-leveling, and garbage collection. The address mapping operation is an operation of changing a logical address received from the host into a physical address used to actually store data in the NVM 2340. Wear-leveling, which is a technique for preventing excessive deterioration of a specific block by uniformly using blocks in the NVM 2340, may illustratively be implemented through a firmware technique that balances erase counts of physical blocks. Garbage collection is a technique for securing usable capacity in the NVM 2340 by copying valid data of a block to a new block and then erasing the old block.

The splitter 2334 may erase data of a block to be erased if a remaining time occurs when data is written to a word line of a block to be written in the NVM 2340. The splitter 2334 may determine a longest write time required for the word line of the block to be written as the reference time, and may determine the remaining time based on the reference time and the write time. The description of the splitter 210 made with reference to FIG. 1 may be applied to the splitter 2334 in a same manner. According to an embodiment, the splitter 2334 may be provided in the CPU 2332.

The packet manager 2335 may generate a packet according to an interface protocol negotiated with the host 2310 or may parse various types of information from a packet received from the host 2310.

In addition, the buffer memory 2337 may temporarily store data to be written to the NVM 2340 or data to be read from the NVM 2340. The buffer memory 2337 may be included in the storage controller 2330, but may be positioned outside the storage controller 2330.

The ECC engine 2338 may perform error detection and correction functions for data read from the NVM 2340. More specifically, the ECC engine 2338 may generate parity bits for write data to be written in the NVM 2340, and the parity bits generated in this way may be stored in the NVM 2340 together with the written data. When reading data from the NVM 2340, the ECC engine 2338 may correct errors in the read data using parity bits read from the NVM 2340 together with the read data, and may output error-corrected read data.

The AES engine 2339 may perform at least one of an encryption operation or a decryption operation on data input to the storage controller 2330 using a symmetric-key algorithm.

Figure 24:
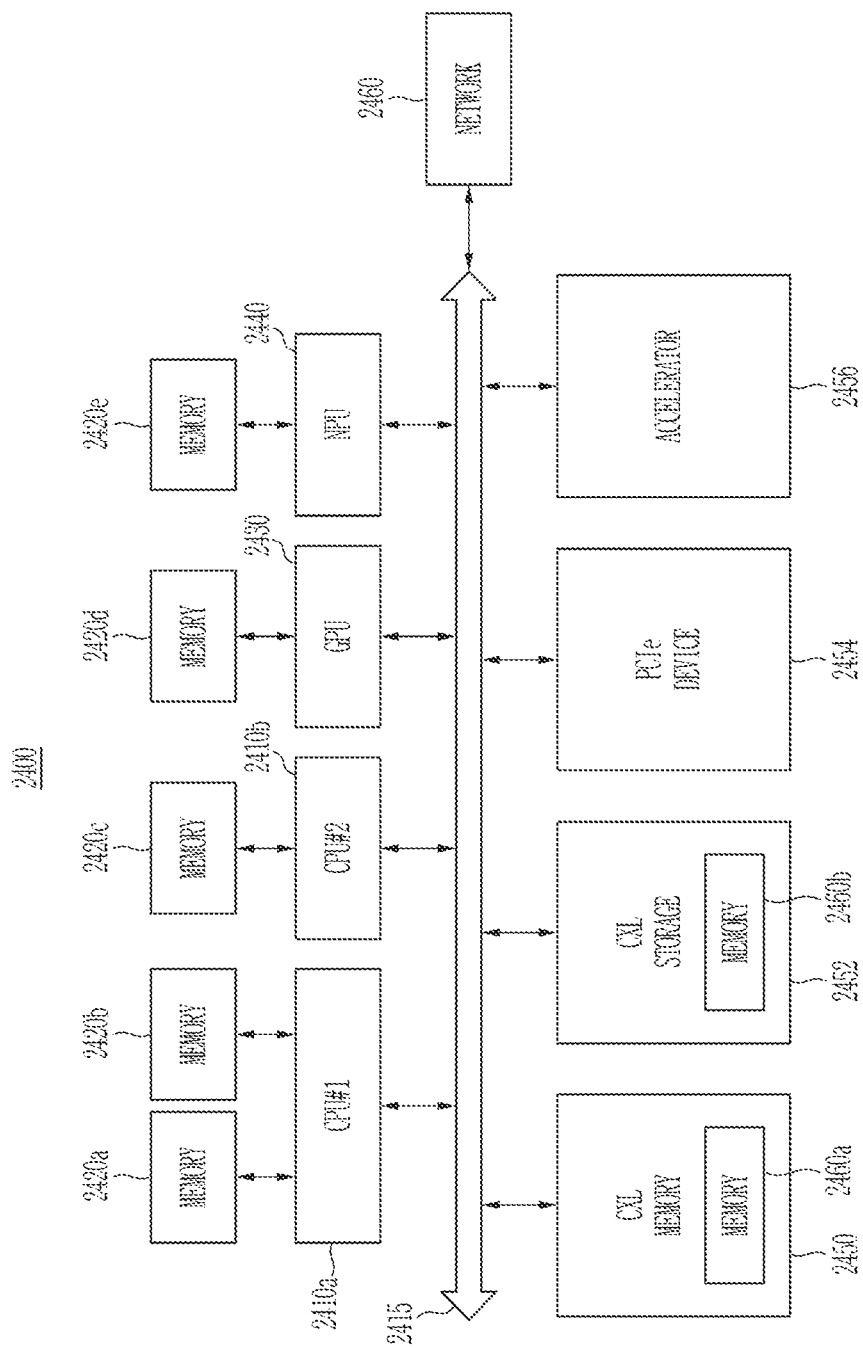
FIG. 24 illustrates a block diagram showing a computer system according to another embodiment.

FIG. 24 illustrates a block diagram showing a computer system according to another embodiment.

Referring to FIG. 24, the computer system 2400 may include a first CPU 2410a, a second CPU 2410b, a GPU 2430, an NPU 2440, a CXL switch 2415, a CXL memory 2450, a CXL storage 2452, a Peripheral Component Interconnect Express (PCIe) device 2454, and an accelerator (CXL device) 2456.

The first CPU 2410a, the second CPU 2410b, the GPU 2430, the NPU 2440, the CXL memory 2450, the CXL storage 2452, the PCIe device 2454, and the accelerator 2456 may be connected to a CXL switch 2415, and they may communicate with each other through the CXL switch 2415.

In an embodiment, each of the first CPU 2410a, the second CPU 2410b, the GPU 2430, and the NPU 2440 may be the host 100 described with reference to FIG. 1, and may be directly coupled to individual memories 2420a, 2420b, 2420c, 2420d, and 2420e.

The CXL storage 2452 may write, read, or erase data according to commands of the first CPU 2410a, the second CPU 2410b, the GPU 2430, and the NPU 2440. The CXL storage 2452 may erase data of a block to be erased during the remaining time while writing data to the block to be written. For example, the first CPU 2410a, the second CPU 2410b, the GPU 2430, and the NPU 2440 may command write data to the first block of the CXL storage 2452, and may command erase data to the second block. The CXL storage 2452 may be the storage device 200 described with reference to FIG. 1.

In an embodiment, in the CXL memory 2450 and the CXL storage 2452, at least some areas of the memories 2460a and 2460b of the CXL memory 2450 and the CXL storage 2452 may be allocated as at least one cache buffer of the first CPU 2410a, the second CPU 2410b, the GPU 2430, the NPU 2440, the CXL memory 2450, the CXL storage 2452, the PCIe device 2454, and the accelerator 2456, by any one or more of the first CPU 2410a, the second CPU 2410b, the GPU 2430, and the NPU 2440.

In an embodiment, the CXL switch 2415 may be connected to the PCIe device 2454 or accelerator 2456 configured to support various functions, and the PCIe device 2454 or the accelerator 2456 may communicate with each of the first CPU 2410a, the second CPU 2410b, the GPU 2430, and the NPU 2440 through the CXL switch 2415, or may access the CXL memory 2450 and the CXL storage 2452.

In an embodiment, the CXL switch 2415 may be connected to an external network 2460 or a fabric, and may be configured to communicate with an external server through the external network 2460 or the fabric.

Figure 25:
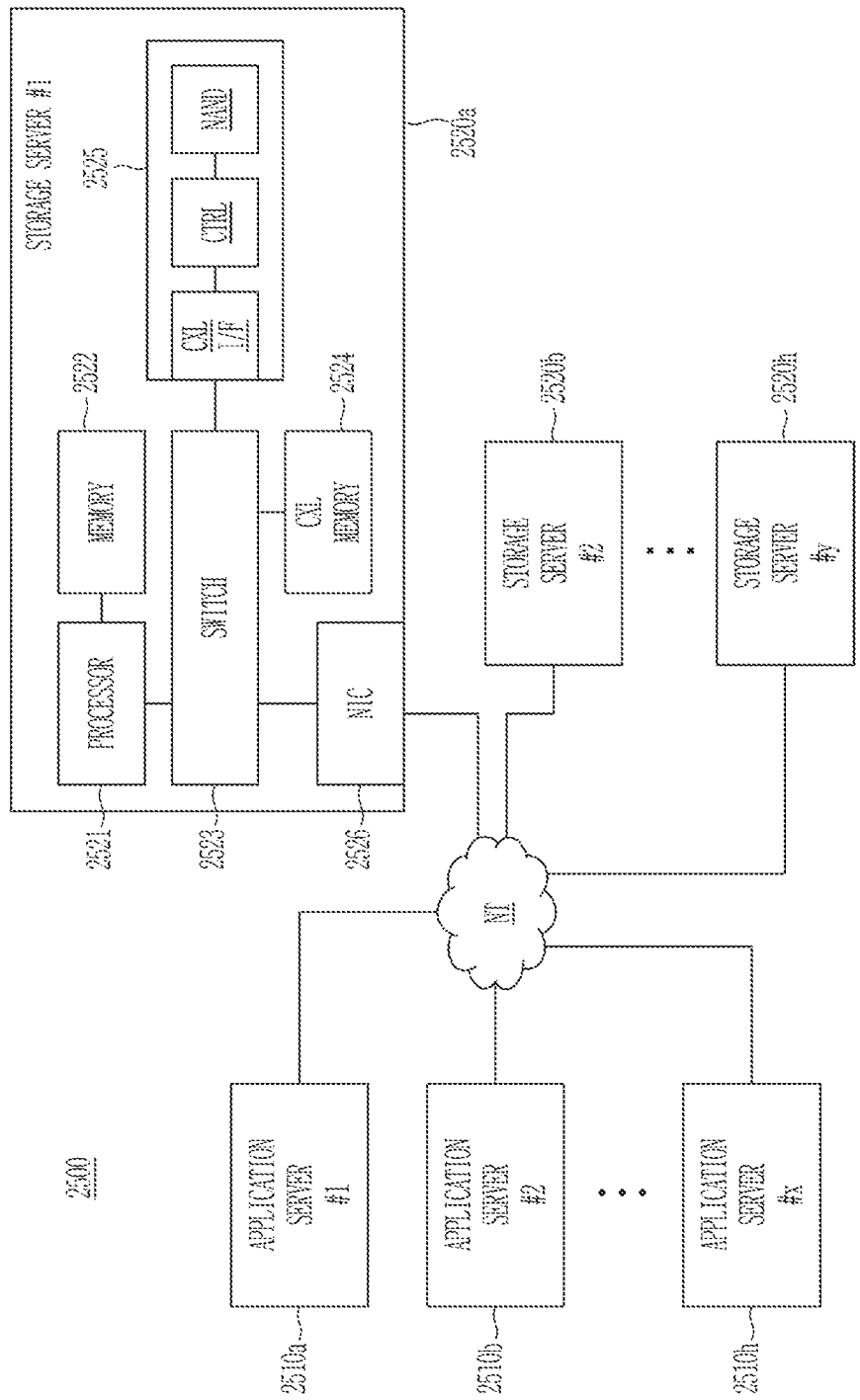
FIG. 25 illustrates a block diagram of a data center to which a computer system according to an embodiment of the present disclosure is applied.

FIG. 25 illustrates a block diagram of a data center to which a computer system according to an embodiment of the present disclosure is applied.

Referring to FIG. 25, a data center 2500, which is a facility that collects various data and provides services, may also be referred to as a data storage center. The data center 2500 may be a system for operating a search engine and a database, and may be a computer system used in a corporate or government institution such as a bank. The data center 2500 may include application servers 2510a to 2510h and storage servers 2520a to 2520h. A number of application servers and a number of storage servers may be variously selected according to an embodiment, and may be different from each other.

Hereinafter, a configuration of the first storage server 2520a will be mainly described. Each of the application servers 2510a to 2510h and the storage servers 2520a to 2520h may have a structure similar to each other, and the application servers 2510a to 2510h and the storage servers 2520a to 2520h may communicate with each other through a network NT.

The first storage server 2520a may include a processor 2521, a memory 2522, a switch 2523, a CXL memory 2524, a storage 2525, and a network interface card (NIC) 2526. The processor 2521 may control an overall operation of the first storage server 2520a, may access the memory 2522, may execute a command loaded into the memory 2522, or may process data. The memory 2522 may be a DDR SDRAM, a HBM, a HMC, a DIMM, an Optane DIMM, and/or a NVMDIMM. The processor 2521 and the memory 2522 may be directly connected, and the number of the processors 2521 and the number of the memories 2522 included in one storage server 2520a may be variously selected.

In an embodiment, the processor 2521 and the memory 2522 may provide a processor-memory pair. In an exemplary embodiment, the number of the processors 2521 and the number of the memory 2522 may be different. The processor 2521 may include a single-core processor or a multi-core processor. The above description of the storage server 2520a may be similarly applied to each of the application servers 2510a to 2510h.

The switch 2523 may be configured to mediate or route communication between various components included in the first storage server 2520a. In an embodiment, the switch 2523 may be an interface or a CXL switch. The switch 2523 may be a switch implemented based on a CXL protocol.

The CXL memory 2524 may be connected to the switch 2523. In an embodiment, the CXL memory 2524 may be used as a memory expander for the processor 2521. Alternatively, the CXL memory 2524 may be allocated as a dedicated memory or a buffer memory for the storage device 2525.

The storage device 2525 may include a CXL interface circuit CXL_IF, a controller CTRL, and a NAND flash. The storage device 2525 may store data, or may output or erase stored data according to a request of the processor 2521.

In an embodiment, the storage device 2525 may be the storage device 200 described with reference to FIG. 1. The storage device 2525 may write, read, or erase data according to a command of the processor 2521. The storage device 2525 may erase data of a block to be erased during the remaining time while writing data to the block to be written. For example, the processor 2521 may command a first block of the storage device 2525 to write data and a second block to erase data.

The NIC 2526 may be connected to the switch 2523. The NIC 2526 may communicate with other storage servers 2520b to 2520h or other application servers 2510a to 2510h through the network NT.

In an embodiment, the NIC 2526 may include a NIC, a network adapter, and the like. The NIC 2526 may be connected to the network NT by a wired interface, a wireless interface, a Bluetooth interface, an optical interface, or the like. The NIC 2526 may include an internal memory, a digital signal processor (DSP), a host bus interface, and the like, and may be connected to the processor 2521 and/or switch 2523 through the host bus interface. In an embodiment, the NIC 2526 may be integrated with at least one of a processor 2521, a switch 2523, or the storage device 2525.

In an embodiment, the network NT may be implemented using a fiber channel (FC), an Ethernet, or the like. In this case, the FC, which is a medium used for relatively high-rate data transmission, may use an optical switch providing high performance and high availability. The storage servers may be provided as file storage, block storage, or object storage depending on an access method of the network NT.

In an embodiment, the network NT may be a storage-only network, such as a storage area network (SAN). For example, the SAN may be an FC-SAN that uses an FC network and is implemented depending on a FC protocol (FCP). As another example, the SAN may be an internet protocol SAN (IP-SAN) that uses a transmission control protocol/internet protocol (TCP/IP) network and is implemented depending on an Internet Small Computer Systems Interface (iSCSI, SCSI over TCP/IP, or Internet SCSI) protocol. In an embodiment, the network NT may be a general network such as a TCP/IP network. For example, the network NT may be implemented depending on protocols such as FC over Ethernet (FCOE), Network Attached Storage (NAS), and NVMe over Fabrics (NVMe-oF).

In an embodiment, at least one of the application servers 2510a to 2510h may store data requested to be stored by a user or a client in one of the storage servers 2520a to 2520h through the network NT. At least one of the application servers 2510a to 2510h may acquire data requested by a user or a client to be read from one of the storage servers 2520a to 2520h through the network NT. For example, at least one of the application servers 2510a to 2510h may be implemented as a web server or a database management system (DBMS).

In an embodiment, at least one of the application servers 2510a to 2510h may access a memory, a CXL memory, or a storage device included in another application server through the network NT, or may access memories, CXL memories, or storage devices included in the storage servers 2520a to 2520h through the network NT. Accordingly, at least one of the application servers 2510a to 2510h may perform various operations on data stored in other application servers and/or storage servers. For example, at least one of the application servers 2510a to 2510h may execute a command to move or copy data between other application servers and/or storage servers. In this case, data may be moved to the memory or the CXL memory of the application servers directly or from the storage device of the storage servers through the memories or CXL memories of the storage servers. Data moving through the network may be encrypted for security or privacy.

In an embodiment, a storage device included in at least one of the application servers 2510a to 2510h and the storage servers 2520a to 2520h may be assigned a CXL memory included in at least one of the application servers 2510a to 2510h and the storage servers 2520a to 2520h as a dedicated area, and the storage device may use the allocated dedicated area as a buffer memory (i.e., may store map data). For example, the storage device 2525 included in the storage server 2520a may be allocated CXL memory included in another storage server (e.g., 2520h), and a CXL memory included in another storage server (e.g., 2520h) may be accessed through the switch 2523 and the NIC 2526. In this case, map data for the storage device 2525 of the first storage server 2520a may be stored in the CXL memory of another storage server 2520h. That is, storage devices and CXL memories of the data center 2500 according to the present disclosure may be connected and implemented in various ways.

In some embodiments, each component or combinations of two or more components described with reference to FIG. 1 to FIG. 25 may be implemented as a digital circuit, a programmable or non-programmable logic device or array, an ASIC, or the like.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A storage device comprising:
a non-volatile memory configured to include a plurality of blocks having a plurality of word lines and to write data to the blocks or to erase data of the blocks; and
a splitter circuit configured to obtain write times for a plurality of word lines of a first block of the blocks while the non-volatile memory writes data in the first block, and to command the non-volatile memory to perform an erase operation on a second block of the blocks by a reference time when a write time for one of the word lines is shorter than the reference time.

2. The storage device of claim 1, wherein the splitter circuit is configured to determine a longest write time when the non-volatile memory writes data to the word lines of the first block as the reference time.

3. The storage device of claim 1, wherein the splitter circuit is configured to command to divide the erase operation to complete data erasing in the second block when the non-volatile memory completes data writing in the first block.

4. The storage device of claim 3, wherein the splitter circuit is configured to command the non-volatile memory to equally divide and perform the erase operation.

5. The storage device of claim 3, wherein
the word lines of the first block have remaining times corresponding to the write times, and
the splitter circuit is configured to command the non-volatile memory to divide and perform the erase operation in proportion to the remaining times.

6. The storage device of claim 3, wherein the splitter circuit is configured to command the non-volatile memory to divide and perform the erase operation based on a minimum time for the erase operation.

7. The storage device of claim 6, wherein
the word lines of the first block have remaining times corresponding to the write times, and
the splitter circuit is configured to compare the minimum time with a remaining time of each word line, and command the erase operation according to a comparison result thereof, and
the remaining time is a time from a time of writing data to a word line to the reference time.

8. The storage device of claim 7, wherein the splitter circuit is configured to command the erase operation when the remaining time is longer than the minimum time, and not command the erase operation when the remaining time is shorter than the minimum time.

9. The storage device of claim 1, wherein
the splitter circuit is configured to transmit an erase start signal to the non-volatile memory when the write time is shorter than the reference time, and transmit an erase stop signal to the non-volatile memory when the reference time is reached, and
the non-volatile memory is configured to start the erase operation in response to the erase start signal, and stop the erase operation in response to the erase stop signal.

10. The storage device of claim 1, wherein the splitter circuit is configured to command an erase operation for a third block among the blocks when the write time is shorter than the reference time when all data of the second block is erased.

11. The storage device of claim 1, wherein the splitter circuit is configured to command an idle state when a write time is shorter than the reference time when all data of the second block is erased.

12. The storage device of claim 1, further comprising
a controller configured to transmit a write signal corresponding to a write command to the non-volatile memory in response to the write command from a host,
wherein the non-volatile memory is configured to write data to the first block in response to the write signal, and transmit a completion signal to the controller when data writing to one word line of the first block is completed.

13. The storage device of claim 12, wherein the controller is configured to calculate a remaining time based on the completion signal and transmit the remaining time to the splitter circuit, and
wherein the splitter circuit is configured to command the erase operation based on the remaining time.

14. The storage device of claim 1, further comprising
a controller configured to transmit a write signal corresponding to a write command to the non-volatile memory in response to the write command from a host,
wherein the non-volatile memory is configured to write data to the first block in response to the write signal, and transmit a write start time and a write completion time to the splitter circuit when data writing to one word line of the first block is completed, and wherein the splitter circuit is configured to calculate a remaining time based on the write start time and the write completion time, and command the erase operation based on the remaining time.

15. The storage device of claim 1, further comprising a controller configured to transmit a write signal corresponding to a write command to circuit and the non-volatile memory in response to the write command from a host, wherein the non-volatile memory is configured to write data to the first block in response to the write signal, and transmit a completion signal to the splitter circuit when data writing to one word line of the first block is completed, and wherein the splitter circuit is configured to calculate a remaining time based on the write signal and the completion signal, and command the erase operation based on the remaining time.

16. A storage system comprising:

a host configured to write data on a plurality of word lines of a first block included in a storage device and to erase data on a second block included in the storage device; and wherein the storage device is configured to obtain write times for the plurality of word lines of the first block while writing data in the first block, and in response to a command from the host, erase data in the second block for a remaining time when a write time for one of the plurality of word lines is shorter than a reference time.

17. The storage system of claim 16, wherein the storage device is configured to determine a longest time among the write times for the plurality of word lines of the first block as the reference time, and determine a difference between the reference time and the write time as the remaining time.

18. The storage system of claim 17, wherein the storage device is configured to erase data of the second block when the remaining time is longer than a minimum time for an erase operation.

19. The storage system of claim 16, wherein the storage device is configured to erase data of another block for the remaining time or is in an idle state when all data of the second block is erased.

20. A memory control method comprising:

obtaining write times for a plurality of word lines of a write target block of a non-volatile memory while writing data in the write target block;

obtaining a remaining time for each word line of the write target block of the non-volatile memory based on a longest write time among the write times while data is being written to the plurality of word lines of the write target block; and erasing data of an erase target block for a remaining time for each of the word lines when a write time for one of the plurality of word lines is shorter than a reference time.

* * * * *